US012641809B2

(12) United States Patent　　(10) Patent No.:　US 12,641,809 B2
Miyashita et al.　　　　　　　　(45) Date of Patent:　　May 26, 2026

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Hiroyuki Miyashita, Matsumoto (JP); Masayuki Momose, Matsumoto (JP); Kazutoshi Sugimura, Okaya (JP); Kenji Kojima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 319 days.

(21) Appl. No.: 18/325,618

(22) Filed: May 30, 2023

(65) Prior Publication Data

US 2024/0014298 A1　　Jan. 11, 2024

(30) Foreign Application Priority Data

Jul. 8, 2022　　(JP) ................................. 2022-110417

(51) Int. Cl.
　　*H10D 62/00*　　　　(2026.01)
　　*H10D 8/00*　　　　(2025.01)
　　　　　　(Continued)

(52) U.S. Cl.
　　CPC ............. *H10D 12/481* (2025.01); *H10D 8/00* (2025.01); *H10D 12/038* (2025.01);
　　　　　　(Continued)

(58) Field of Classification Search
　　CPC ...... H10D 12/481; H10D 8/00; H10D 12/038; H10D 30/0297; H10D 30/668;
　　　　　　(Continued)

(56) References Cited

U.S. PATENT DOCUMENTS

2009/0294870 A1* 12/2009 Arai ....................... H10D 64/62
　　　　　　　　　　　　　　　　438/234
2009/0294987 A1* 12/2009 Yamada ............ H01L 21/76898
　　　　　　　　　　　　　　　　257/E21.585
(Continued)

FOREIGN PATENT DOCUMENTS

JP　　　H0936356 A　　2/1997
JP　　　2006059940 A　　3/2006
(Continued)

OTHER PUBLICATIONS

Office Action issued for corresponding Japanese Patent Application No. 2022-110417 on Feb. 17, 2026.

*Primary Examiner* — Sheikh Maruf

(74) *Attorney, Agent, or Firm* — Rabin & Berdo, P.C.

(57) ABSTRACT

A diode formed by a polysilicon layer is disposed between a field oxide film and an interlayer insulating film, in a semiconductor substrate, at a front surface of the semiconductor substrate. One resist mask is used to form contact holes of the interlayer insulating film and contact trenches and a $p^+$-type region of the polysilicon layer. The contact trenches are continuously formed from bottoms of the contact holes, respectively, in a depth direction. A low-resistance contact between the $p^+$-type region and an anode electrode is formed at least at a bottom of the contact trench. During the formation of the $p^+$-type region, while a p-type impurity is ion-implanted in an inner wall of the contact trench 3b, an n-type cathode region maintains an n-type conductivity thereof and a contact with a cathode electrode is formed at sidewalls of the contact trench.

15 Claims, 16 Drawing Sheets

(51) Int. Cl.

| | | |
|---|---|---|
| *H10D 12/00* | (2025.01) | |
| *H10D 12/01* | (2025.01) | |
| *H10D 30/01* | (2025.01) | |
| *H10D 30/66* | (2025.01) | |
| *H10D 62/10* | (2025.01) | |

(52) U.S. Cl.
CPC ....... H10D 30/0297 (2025.01); H10D 30/668 (2025.01); H10D 62/127 (2025.01)

(58) Field of Classification Search
CPC .... H10D 62/127; H10D 62/128; H10D 48/40; H10D 84/143; H10D 8/045; H10D 62/83; H10D 64/23; H10D 62/40; H10D 84/811
USPC .......................................................... 257/330
See application file for complete search history.

(56) References Cited

U.S. PATENT DOCUMENTS

| | | | | |
|---|---|---|---|---|
| 2010/0207203 | A1* | 8/2010 | Han | H01L 21/28123 |
| | | | | 257/330 |

| | | | | |
|---|---|---|---|---|
| 2012/0132984 | A1* | 5/2012 | Mifuji | H01L 21/76831 |
| | | | | 257/288 |
| 2016/0064476 | A1* | 3/2016 | Kobayashi | H10D 62/115 |
| | | | | 257/139 |
| 2017/0053991 | A1 | 2/2017 | Yao | |
| 2017/0229448 | A1* | 8/2017 | Tanaka | H01L 23/585 |
| 2018/0182631 | A1* | 6/2018 | Kumagae | H10D 64/037 |
| 2019/0067029 | A1* | 2/2019 | Kuneshita | H10D 12/481 |
| 2019/0109065 | A1* | 4/2019 | Hashizume | H10D 62/8325 |
| 2020/0312975 | A1* | 10/2020 | Fukuda | G05F 1/463 |
| 2020/0388611 | A1* | 12/2020 | Onozawa | H01L 21/266 |
| 2021/0265230 | A1* | 8/2021 | Kubouchi | H10D 62/53 |
| 2022/0013645 | A1 | 1/2022 | Shimosawa et al. | |
| 2022/0140121 | A1* | 5/2022 | Miyata | H10D 62/177 |
| | | | | 257/330 |

FOREIGN PATENT DOCUMENTS

| | | | |
|---|---|---|---|
| JP | 2009289791 | A | 12/2009 |
| JP | 2017041491 | A | 2/2017 |
| JP | 2017143136 | A | 8/2017 |
| JP | 2020167338 | A | 10/2020 |
| JP | 2022016842 | A | 1/2022 |

* cited by examiner

INTERLAYER INSULATING FILM 11

10

| OXIDE FILM | ~102 |
| Si SUBSTRATE | ~101 |

| p-TYPE POLY-Si | ~103 |
| OXIDE FILM | ~102 |
| Si SUBSTRATE | ~101 |

FIG.31
RELATED ART
103
{ 105  104 }    111
| INTERLAYER INSULATING FILM | | |
| n-TYPE POLY-Si | p-TYPE POLY-Si | 107 |
| OXIDE FILM | | 102 |
| Si SUBSTRATE | | 101 |
FIG.32
RELATED ART
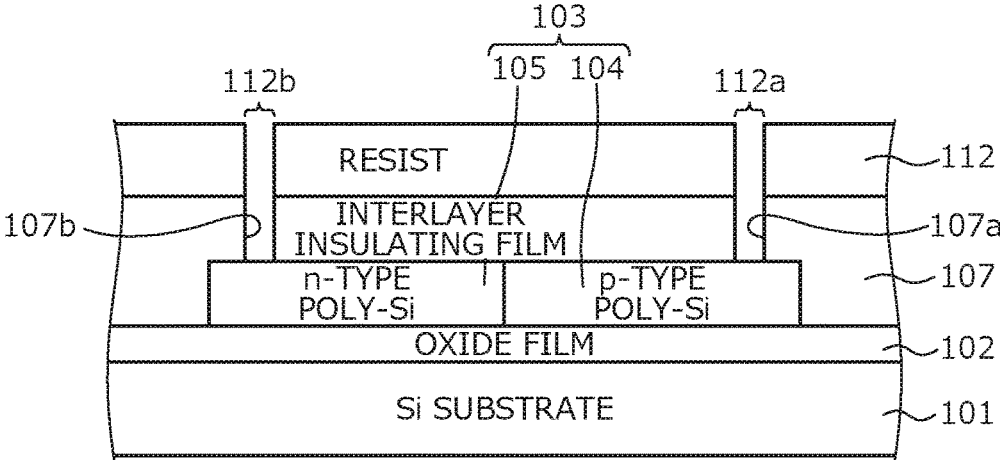
103
{ 105  104 }
112b        112a
RESIST — 112
107b   INTERLAYER INSULATING FILM   107a
n-TYPE POLY-Si   p-TYPE POLY-Si — 107
OXIDE FILM — 102
Si SUBSTRATE — 101
FIG.33
RELATED ART
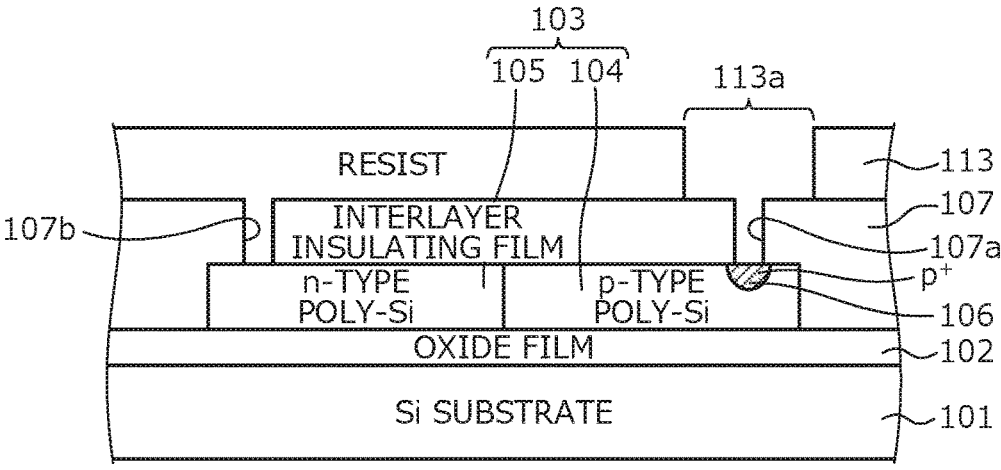
103
{ 105  104 }    113a
RESIST — 113
107b   INTERLAYER INSULATING FILM — 107
107a
n-TYPE POLY-Si   p-TYPE POLY-Si   $p^+$ — 106
OXIDE FILM — 102
Si SUBSTRATE — 101

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2022-110417, filed on Jul. 8, 2022, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, in power semiconductor devices such as insulated gate bipolar transistors (IGBTs) and metal oxide semiconductor field effect transistors (MOSFETs) having insulated gates with a three-layered structure including a metal, an oxide film, and a semiconductor, etc., it is commonly known that damage and the like due to overheating is prevented by detecting device temperature during on-operation by using a temperature sensor built into a single module or a single semiconductor substrate (semiconductor chip).

When a temperature sensor is built into a single power semiconductor substrate having a semiconductor device, direct measurement of the device temperature (temperature of the semiconductor substrate) of the power semiconductor device by the temperature sensor is enabled, whereby more accurate detection of the device temperature of the power semiconductor device is possible. As for a conventional semiconductor device, a device has been proposed in which, as a temperature sensor, a pn junction diode is built into a single semiconductor substrate having a power semiconductor device (for example, refer to Japanese Laid-Open Patent Publication No. H9-036356, Japanese Laid-Open Patent Publication No. 2009-289791, Japanese Laid-Open Patent Publication No. 2020-167338, and Japanese Laid-Open Patent Publication No. 2017-143136). Current/voltage characteristics of the pn junction diode vary depending on temperature and thus, the device temperature of the power semiconductor device may be detected from temperature characteristics of the pn junction diode.

Japanese Laid-Open Patent Publication No. H9-036356 and Japanese Laid-Open Patent Publication No. 2009-289791 disclose a structure in which a diffused diode formed by a pn junction formed by an impurity diffused region that is electrically insulated from a main semiconductor device is provided in a semiconductor substrate, at a front surface of the semiconductor substrate. Japanese Laid-Open Patent Publication No. 2020-167338 discloses a structure in which a polysilicon diode formed by a pn junction in a polysilicon (poly-Si) layer is embedded in a trench that is formed at a front surface of a semiconductor substrate. Japanese Laid-Open Patent Publication No. 2017-143136 discloses a structure in which a recess is formed at a surface of a local oxidation of silicon (LOCOS) film formed by local oxidation of a front surface of a semiconductor substrate and a polysilicon diode is embedded in the recess.

A structure of a conventional semiconductor devices is described. FIG. 27 is a cross-sectional view depicting the structure of a conventional semiconductor device. A conventional semiconductor device 110 depicted in FIG. 27 has, on a single semiconductor substrate (semiconductor chip) 101, a main semiconductor device (not depicted) such as an IGBT, MOSFET, or the like and a diode 111 that is electrically insulated from the main semiconductor device. The diode 111 functions as a temperature sensor that detects a device temperature (temperature of the semiconductor substrate 101) of the main semiconductor device, using temperature characteristics of the diode 111.

The diode 111 is a polysilicon diode formed by a pn junction between a p-type anode region 104 and an n-type cathode region 105 in a polysilicon layer 103. The polysilicon layer 103 is provided on a front surface of the semiconductor substrate 101, via a field oxide film 102. The p-type anode region 104 and the n-type cathode region 105 are adjacent to each other in a direction parallel to the front surface of the semiconductor substrate 101. The p-type anode region 104 and the n-type cathode region 105 have the same thickness.

In the polysilicon layer 103, between an upper surface (surface facing an interlayer insulating film 107) of the polysilicon layer 103 and the p-type anode region 104, a $p^+$-type anode contact region 106 is selectively formed in contact with the p-type anode region 104 by ion-implantation of a p-type impurity at a high concentration. In the polysilicon layer 103, a portion adjacent to the n-type cathode region 105 and the n-type cathode region 105 are free of regions ion-implanted with a high concentration of an impurity. The polysilicon layer 103 is covered by the interlayer insulating film 107.

In contact holes 107a, 107b of the interlayer insulating film 107, the $p^+$-type anode contact region 106 and the n-type cathode region 105 are exposed, respectively. An anode electrode 108 is embedded in the contact hole 107a and at the front surface of the semiconductor substrate 101, forms a low-resistance contact (contact portion) with the $p^+$-type anode contact region 106. A cathode electrode 109 is embedded in the contact hole 107b and forms a contact with the n-type cathode region 105, at the front surface of the semiconductor substrate 101.

A method of manufacturing the conventional semiconductor device depicted in FIG. 27 is described with reference to FIGS. 28 to 33. FIGS. 28, 29, 30, 31, 32, and 33 are cross-sectional views depicting states of the conventional semiconductor device during manufacture. First, as depicted in FIG. 28, the field oxide film 102 is formed at the front surface of the semiconductor substrate 101 containing silicon (Si). Next, as depicted in FIG. 29, the polysilicon layer 103 of a p-type is formed on the field oxide film 102.

Next, as depicted in FIG. 30, by ion-implantation of an n-type impurity, a portion of the polysilicon layer 103 inverted to an n-type and the n-type cathode region 105 that penetrates through the polysilicon layer 103 in a depth direction are formed. A portion (in FIG. 30, the right side) of the polysilicon layer 103 left as a p-type and in a direction parallel to the front surface of the semiconductor substrate 101, adjacent to the portion constituting the n-type cathode region 105 constitutes the p-type anode region 104.

Next, as depicted in FIG. 31, portions of the polysilicon layer 103 other than a portion forming the diode 111 are removed. As a result, the diode 111 constituted by a pn junction between the p-type anode region 104 and the n-type cathode region 105 is formed. Next, the interlayer insulating film 107 is formed on the front surface of the semiconductor substrate 101 and the interlayer insulating film 107 covers the p-type anode region 104 (the polysilicon layer 103 of a p-type) and the n-type cathode region 105 (the polysilicon layer 103 of an n-type).

Next, as depicted in FIG. 32, a resist mask 112 opened at portions 112a, 112b that correspond to formation regions of the contact holes 107a, 107b is formed on the interlayer insulating film 107. Next, the interlayer insulating film 107 is etched using the resist mask 112, whereby the contact holes 107a, 107b are formed in the interlayer insulating film 107, and the p-type anode region 104 and the n-type cathode region 105 are exposed in the contact holes 107a, 107b, respectively. Subsequently, the resist mask 112 is removed.

Next, as depicted in FIG. 33, a resist mask 113 having an opening 113a that exposes only the contact hole 107a is formed in the interlayer insulating film 107. Next, a p-type impurity is ion-implanted using the resist mask 113 and the interlayer insulating film 107 as a mask, whereby the p$^+$-type anode contact region 106 is formed in the p-type anode region 104, at the surface thereof exposed by the contact hole 107a. The n-type cathode region 105 is free of the ion-implanted p-type impurity. Subsequently, the resist mask 113 is removed.

Thereafter, the anode electrode 108 is formed so as to be embedded in the contact hole 107a, whereby a contact between the anode electrode 108 and the p$^+$-type anode contact region 106 is formed. The cathode electrode 109 is formed so as to be embedded in the contact hole 107b, whereby a contact between the cathode electrode 109 and the n-type cathode region 105 is formed. Thus, the semiconductor device 110 depicted in FIG. 27 is completed.

Further, as for a conventional trench gate MOSFET, a device has been proposed that has a contact trench between any adjacent two gate trenches, forms a contact between a source electrode and an n$^+$-type source region, at a sidewall of the contact trench, and forms a contact between the source electrode and the p$^+$-type contact region, at a bottom of the contact trench (for example, refer to Japanese Laid-Open Patent Publication No. 2006-059940).

SUMMARY OF THE INVENTION

According to an embodiment of the invention, a semiconductor device includes: a semiconductor substrate having a first main surface and a second main surface opposite to each other; an insulating film provided on the semiconductor substrate; a polysilicon layer provided at the first main surface of the semiconductor substrate via the insulating film; a first-conductivity-type region and a second-conductivity-type region that are provided in the polysilicon layer and that are adjacent to each other in a direction parallel to the first main surface of the semiconductor substrate to form a pn junction therebetween, whereby a diode is formed by the pn junction; an interlayer insulating film provided at the first main surface of the semiconductor substrate, the interlayer insulating film covering the polysilicon layer; a first contact hole penetrating through the interlayer insulating film in a depth direction of the semiconductor device, the first contact hole having a first bottom end that reaches the polysilicon layer; a second contact hole penetrating through the interlayer insulating film in the depth direction, the second contact hole having a second bottom end that reaches the polysilicon layer; a first contact trench penetrating the polysilicon layer to be continuous from the first bottom end of the first contact hole, an outer periphery of the first contact trench being surrounded by the first-conductivity-type region; a second contact trench penetrating the polysilicon layer to be continuous from the second bottom end of the second contact hole in the depth direction, an outer periphery of the second contact trench being surrounded by the second-conductivity-type region; a first first-conductivity-type high-concentration region selectively provided in the polysilicon layer and being in contact with the first-conductivity-type region, so as to be in direct contact with a bottom, sidewalls or both the bottom and the sidewalls of the first contact trench, the first first-conductivity-type high-concentration region having an impurity concentration that is higher than an impurity concentration of the first-conductivity-type region; a first electrode embedded in the first contact hole and the first contact trench, and being in contact with the first first-conductivity-type high-concentration region; and a second electrode embedded in the second contact hole and the second contact trench, and being in contact with the second-conductivity-type region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 31 is a cross-sectional view depicting a state of the conventional semiconductor device during manufacture.

FIG. 32 is a cross-sectional view depicting a state of the conventional semiconductor device during manufacture.

FIG. 33 is a cross-sectional view depicting a state of the conventional semiconductor device during manufacture.

DETAILED DESCRIPTION OF THE INVENTION

Figure 1:
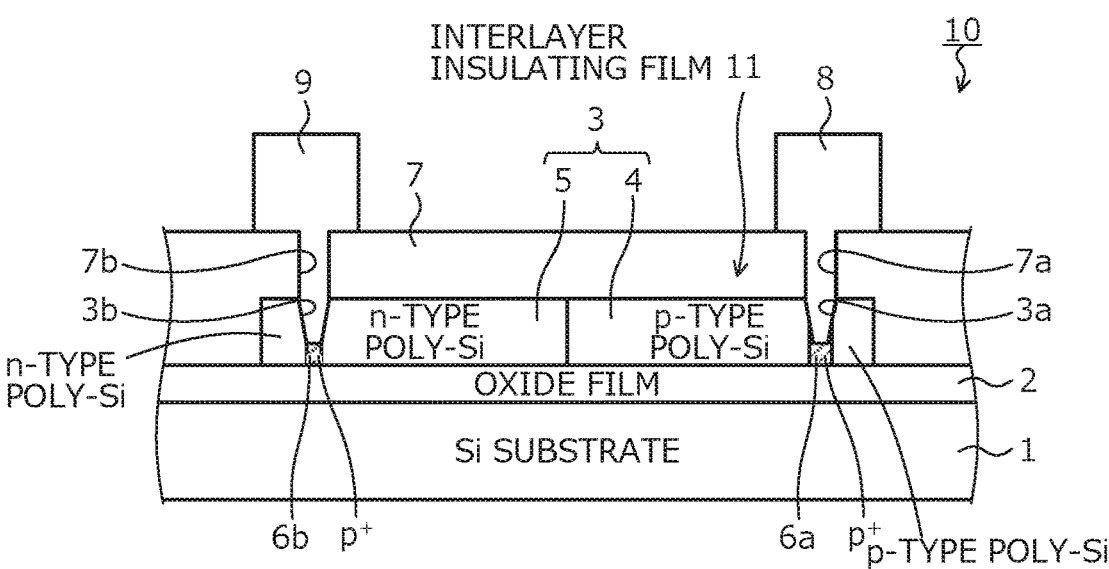
FIG. 1 is a cross-sectional view depicting a structure of a semiconductor device according to a first embodiment.

First, problems associated with the conventional techniques are discussed. In the method of manufacturing the conventional semiconductor device 110 (refer to FIGS. 27 to 33), a process for covering the contact hole 107b with the resist mask 113 is necessary so that no p-type impurity is ion-implanted in the n-type cathode region 105 when the $p^+$-type anode contact region 106 is formed (refer to FIG. 33). In other words, to form the $p^+$-type anode contact region 106, the manufacturing processes increase by one set of processes (depositing resist, pattern formation, and removal) for forming the resist mask 113, which leads to increased cost.

On the other hand, in an instance in which the resist mask 113 is omitted, in the portion exposed by the contact hole 107b, a p-type impurity is ion-implanted in the n-type cathode region 105 (the polysilicon layer 103 of an n-type), thereby decreasing the n-type impurity concentration, whereby the contact resistance between the cathode electrode 109 and the n-type cathode region 105 increases. In an instance in which a dose amount of the p-type impurity ion-implanted in the n-type cathode region 105 is large, the n-type cathode region 105 may be inverted to a p-type at a portion thereof forming a contact with the cathode electrode 109, whereby the diode 111 may not operate.

Embodiments of a semiconductor device and a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or. In the description of the embodiments below and the accompanying drawings, main portions that are identical are given the same reference numerals and are not repeatedly described.

A structure of a semiconductor device according to a first embodiment is described. FIG. 1 is a cross-sectional view depicting the structure of the semiconductor device according to the first embodiment. In FIG. 1, a semiconductor substrate 1, a field oxide film 2, and an interlayer insulating film 7 are indicated as "Si substrate", "oxide film", and "interlayer insulating film", respectively (similarly in FIGS. 2 to 10). Further, in FIG. 1, in a polysilicon layer 3, a portion corresponding to a p-type anode region 4 is indicated as "p-type poly-Si" while a portion corresponding to an n-type cathode region 5 is indicated as "n-type poly-Si" (similarly in FIGS. 4 to 10).

A semiconductor device 10 according to the first embodiment depicted in FIG. 1 has on a semiconductor substrate (semiconductor chip) 1 that contains silicon (Si), a main semiconductor device (not depicted) such as an IGBT, a MOSFET, etc., and a diode 11 electrically insulated from the main semiconductor device (the semiconductor substrate 1). The main semiconductor device is disposed in an active region. The diode 11 is disposed in a region excluding the active region. The diode 11, for example, functions as a temperature sensor that uses temperature characteristics thereof to detect a device temperature (temperature of the semiconductor substrate 1) of the main semiconductor device.

The diode 11 is a polysilicon diode formed in the polysilicon layer 3 by a pn junction between the p-type anode region (first-conductivity-type region) 4 and the n-type cathode region (second-conductivity-type region) 5. The polysilicon layer 3 is provided on the front surface of the semiconductor substrate 1 via the field oxide film (insulating film) 2 and is electrically insulated from the main semiconductor device (the semiconductor substrate 1) by the field oxide film 2 and the interlayer insulating film 7. A thickness of the polysilicon layer 3 is, for example, about 500 nm. A thickness of the field oxide film 2 is, for example, about 300 nm.

The p-type anode region 4 and the n-type cathode region 5 are adjacent to each other in a direction parallel to the front surface of the semiconductor substrate 1. The p-type anode region 4 and the n-type cathode region 5 have a same thickness. An n-type impurity concentration of the n-type cathode region 5 is, for example, higher than a p-type impurity concentration of the p-type anode region 4. Contact trenches (first and second contact trenches) 3a, 3b are provided in the polysilicon layer 3 (the p-type anode region 4 and the n-type cathode region 5). The contact trenches 3a, 3*b* are connected to later-described contact holes (first and second contact holes) 7*a*, 7*b*, in the depth direction.

The contact trenches 3*a*, 3*b* terminate at substantially a same depth position in the polysilicon layer 3, so that the bottoms of the contact trenches 3*a*, 3*b* in the depth direction are located within the polysilicon layer 3. The polysilicon layer 3 is present between the contact trenches 3*a*, 3*b* and the field oxide film 2. Each of the contact trenches 3*a*, 3*b* has a width, in a direction parallel to the front surface of the semiconductor substrate 1, that is at least substantially equal to a width of the contact holes 7*a*, 7*b*, at respective portions thereof connected to the contact holes 7*a*, 7*b* (interface between the polysilicon layer 3 and the interlayer insulating film 7), so that the contact trenches 3*a*, 3*b* are respectively continuous from bottom ends (first bottom end and second bottom end) of the contact holes 7*a*, 7*b*. A cross-sectional shape of each of the contact trenches 3*a*, 3*b*, in the cross-sectional view of the semiconductor device, may be a substantially rectangular shape having substantially a same width from an opening thereof to a bottom thereof or may be a tapered shape (trapezoid) having a width that gradually decreases from the opening thereof to the bottom thereof.

In an instance in which the cross-sectional shape of the contact trench 3*a* formed in the p-type anode region 4 is a tapered shape, a p-type impurity is ion-implanted to form a later-described p$^+$-type region 6*a* at sidewalls of the contact trench 3*a* as well. In this instance, the later-described p$^+$-type region 6*a* may be further formed at the sidewalls of the contact trench 3*a*. The contact trenches 3*a*, 3*b* are formed concurrently and have substantially a same depth and a same cross-sectional shape. Substantially the same width, substantially the same depth, substantially the same depth position, and substantially the same cross-sectional shape mean, respectively, the same width, the same depth, the same depth position, and the same cross-sectional shape within a range that includes allowable error due to manufacturing process variation.

The p-type anode region 4 surrounds a periphery of the contact trench 3*a*. The p-type anode region 4 is exposed at the sidewalls of the contact trench 3*a*. The n-type cathode region 5 surrounds a periphery of the contact trench 3*b*. The n-type cathode region 5 is exposed at the sidewalls of the contact trench 3*b*. Further, in the polysilicon layer 3, at positions closer to the semiconductor substrate 1 than are the bottoms of the contact trenches 3*a*, 3*b*, p$^+$-type regions (first and second first-conductivity-type high-concentration regions) 6*a*, 6*b* (hatched portions) are selectively provided facing the bottoms of the contact trenches 3*a*, 3*b*, respectively.

The p$^+$-type region 6*a* is in contact with the p-type anode region 4. The p$^+$-type region 6*a* surrounds the bottom of the contact trench 3*a* and is exposed at the bottom of the contact trench 3*a*. The p$^+$-type region 6*a* is a p$^+$-type anode contact region. The bottom, the sidewalls or both the bottom and the sidewalls of the contact trench 3*a* are in direct contact with the p$^+$-type region 6*a*, whereby the p$^+$-type region 6*a* is in ohmic contact with a later-described anode electrode (first electrode) 8 that is embedded in the contact hole 7*a* and the contact trench 3*a*. The p$^+$-type region 6*a* has a function of reducing contact resistance with the anode electrode 8. The p$^+$-type region 6*a* may be in contact with the field oxide film 2. The p-type anode region 4 may be present between the p$^+$-type region 6*a* and the field oxide film 2.

The p$^+$-type region 6*a* may extend between the p-type anode region 4 and the sidewalls of the contact trench 3*a* and thereby be exposed at the sidewalls of the contact trench 3*a*. For example, in the cross-sectional view of the semiconductor device, the contact trench 3*a* has a tapered shape, whereby ion-implantation of a p-type impurity (first-conductivity-type impurity) is facilitated not only at the bottom of the contact trench 3*a* but also at the sidewalls thereof. As a result, formation of the p$^+$-type region 6*a* from the bottom of the contact trench 3*a* and along the sidewalls thereof is facilitated. At the sidewalls of the p$^+$-type region 6*a*, a thickness (depth from the sidewalls) of the p$^+$-type region 6*a* may be less than that at the bottom of the contact trench 3*a*.

The p$^+$-type region 6*b* is in contact with the n-type cathode region 5. The p$^+$-type region 6*b* surrounds the bottom of the contact trench 3*b* and is exposed at the bottom of the contact trench 3*b*. As described hereinafter, the p$^+$-type region 6*b* is a region inevitably formed in the contact trench 3*b* by the ion implantation of a p-type impurity when the p$^+$-type region 6*a* is formed and is a non-functional region that does not function as the diode 11. The p$^+$-type region 6*b* may be in contact with the field oxide film 2. The n-type cathode region 5 may be present between the p$^+$-type region 6*b* and the field oxide film 2.

The contact trench 3*a*, in the cross-sectional view of the semiconductor device, may have a cross-sectional shape that is rectangular or tapered; and the p$^+$-type region 6*b* is provided only at the bottom of the contact trench 3*b* and between the sidewalls of the contact trench 3*a* and the n-type cathode region 5 is free of the p$^+$-type region 6*b*. Even when a p-type impurity is ion-implanted in the sidewalls of the contact trench 3*b* during the formation of the p$^+$-type region 6*b*, portions of the n-type cathode region 5 exposed at the sidewalls of the contact trench 3*b* remain an n-type and only a portion of the n-type cathode region 5 at the bottom of the contact trench 3*b* is inverted to a p-type.

The polysilicon layer 3 (the p-type anode region 4 and the n-type cathode region 5) are covered by the interlayer insulating film 7. In the interlayer insulating film 7, the contact holes 7*a*, 7*b* that penetrate through the interlayer insulating film 7 in the depth direction are provided. In the contact holes 7*a*, 7*b*, the contact trenches 3*a*, 3*b* of the polysilicon layer 3 (the diode 11) are exposed, respectively. The contact holes 7*a*, 7*b*, for example, have substantially a same width. In the cross-sectional view of the semiconductor device, the contact holes 7*a*, 7*b* have a cross-sectional shape that is, for example, substantially rectangular.

The anode electrode 8 is embedded in the contact hole 7*a* and the contact trench 3*a*, forms a contact (contact portion) with the p-type anode region 4 at the sidewalls of the contact trench 3*a*, and forms a contact with the p$^+$-type region 6*a* at the bottom (or the bottom and the sidewalls) of the contact trench 3*a*. The anode electrode 8 may form a contact with the p$^+$-type region 6*a* in an entire area of the surface of an inner wall of the contact trench 3*a* and may be electrically connected to the p-type anode region 4 via the p$^+$-type region 6*a*.

In other words, in the entire area of the surface of the inner wall of the contact trench 3*a*, the anode electrode 8 forms a contact with the polysilicon layer 3, which is of a p-type. A cathode electrode (second electrode) 9 is embedded in the contact hole 7*b* and the contact trench 3*b* and forms a contact with the n-type cathode region 5 at the sidewalls of the contact trench 3. The p$^+$-type region 6*b* is exposed at the bottom of the contact trench 3*b* and thus, at the bottom of the contact trench 3*b*, no contact between the cathode electrode 9 and the polysilicon layer 3, which is of an n-type (the n-type cathode region 5), is formed.

Figure 2:
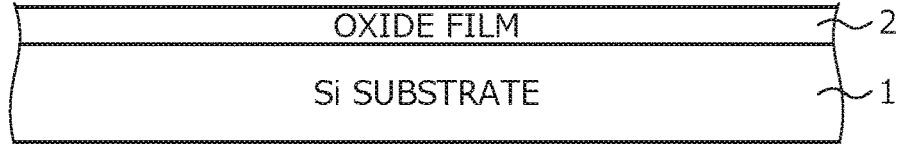
FIG. 2 is a cross-sectional view depicting a state of the semiconductor device according to the first embodiment during manufacture.
Figure 3:
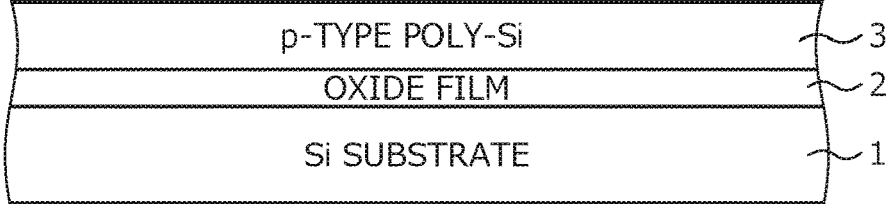
FIG. 3 is a cross-sectional view depicting a state of the semiconductor device according to the first embodiment during manufacture.

A method of manufacturing the semiconductor device 10 according to the first embodiment is described with reference to FIGS. 2 to 8. FIGS. 2, 3, 4, 5, 6, 7 and 8 are cross-sectional views depicting states of the semiconductor device according to the first embodiment during manufacture. In FIGS. 2 to 8, of the semiconductor substrate 1, only a formation region of the diode 11 is depicted and regions not forming the main semiconductor device are not depicted. First, as depicted in FIG. 2, the field oxide film 2 is formed at the front surface of the semiconductor substrate 1. Next, as depicted in FIG. 3, for example, the polysilicon layer 3 of a p-type and doped with a p-type impurity such as boron (B) is formed on the field oxide film 2 (first process).

Figure 4:
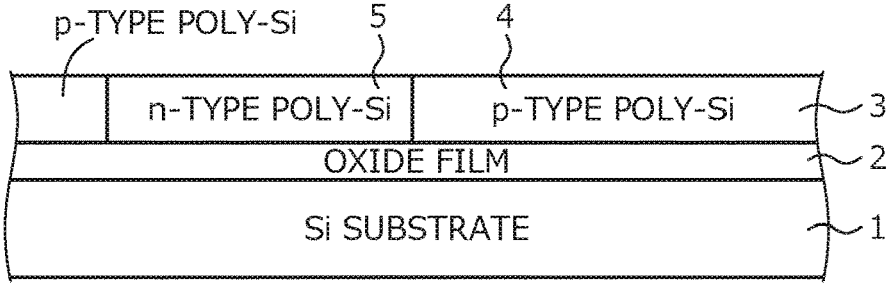
FIG. 4 is a cross-sectional view depicting a state of the semiconductor device according to the first embodiment during manufacture.

Next, as depicted in FIG. 4, for example, a portion of the polysilicon layer 3, which is a p-type, is inverted to an n-type by ion-implantation of an n-type impurity such as arsenic (As), whereby the n-type cathode region 5 (the polysilicon layer 3 of an n-type) that penetrates through the polysilicon layer 3 in the depth direction is formed. The n-type impurity concentration of the n-type cathode region 5 is set high enough that even when the n-type cathode region 5 is ion-implanted with a p-type impurity at a subsequent process (formation of the p$^+$-type regions 6a, 6b), the n-type conductivity thereof is maintained. For example, when the n-type cathode region 5 is formed by inverting the polysilicon layer 3 from a p-type to an n-type, the n-type cathode region 5 is set to satisfy the n-type impurity concentration conditions above.

Further, the polysilicon layer 3 is inverted from a p-type to an n-type to thereby form the n-type cathode region 5, whereby the n-type cathode region 5 satisfies the n-type impurity concentration conditions that prevent predetermined characteristics of the diode 11 from changing even when the n-type cathode region 5 is ion-implanted with a p-type impurity at a subsequent process (formation of the p$^+$-type regions 6a, 6b). A portion (in FIG. 4, the right side) of the polysilicon layer 3 left as a p-type and adjacent to the n-type cathode region 5 in a direction parallel to the front surface of the semiconductor substrate 1 constitutes the p-type anode region 4 (the polysilicon layer 3 of a p-type).

Figure 5:
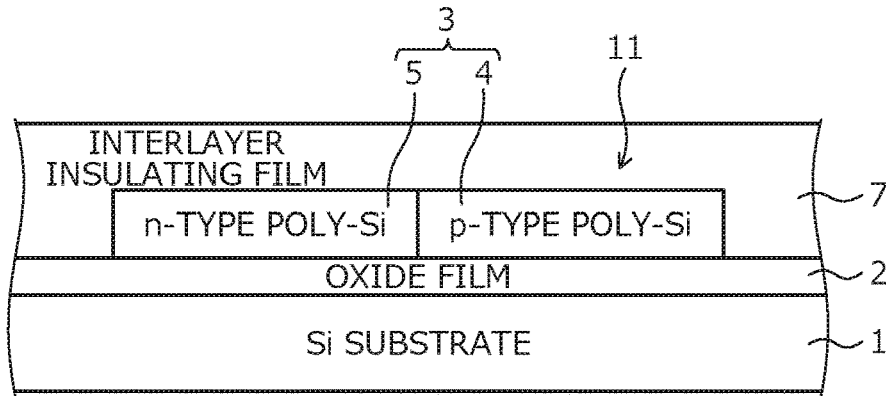
FIG. 5 is a cross-sectional view depicting a state of the semiconductor device according to the first embodiment during manufacture.

Next, as depicted in FIG. 5, portions of the polysilicon layer 3 excluding portions corresponding to the diode 11 are removed by etching. By the processes up to here, the diode 11 formed by the pn junction between the p-type anode region 4 and the n-type cathode region 5 is formed (second process). The n-type cathode region 5 may be formed after removal of the portions that are left of the polysilicon layer 3 excluding the portions constituting the diode 11. Next, the interlayer insulating film 7 is formed on the front surface of the semiconductor substrate 1 and the interlayer insulating film 7 covers the polysilicon layer 3 (the p-type anode region 4 and the n-type cathode region 5) (third process).

Figure 6:
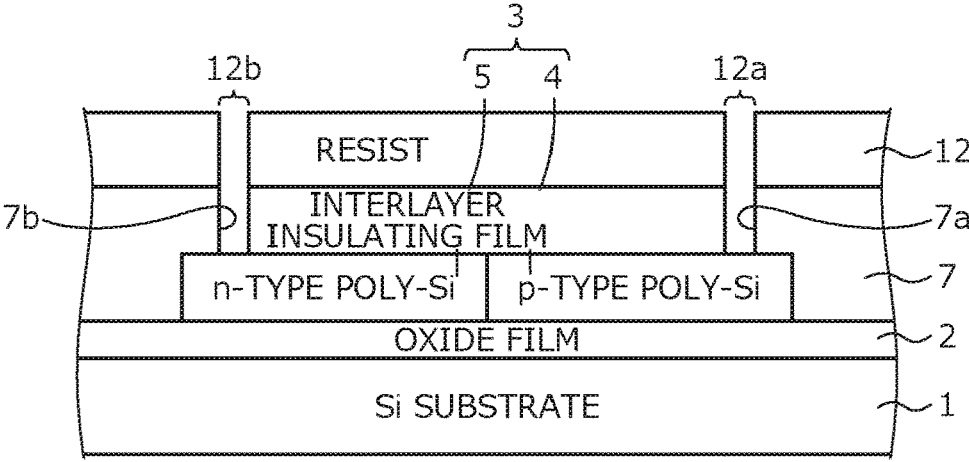
FIG. 6 is a cross-sectional view depicting a state of the semiconductor device according to the first embodiment during manufacture.

Next, as depicted in FIG. 6, a resist mask 12 opened at portions 12a, 12b corresponding to formation regions of the contact holes 7a, 7b is formed on the interlayer insulating film 7 (fourth process). Next, the interlayer insulating film 7 is etched using the resist mask 12, whereby the contact holes 7a, 7b that expose the p-type anode region 4 and the n-type cathode region 5, respectively, are formed in the interlayer insulating film 7 (fifth process). In the etching of the interlayer insulating film 7, for example, a fluorinated gas such as trifluoromethane (CHF$_3$) gas, a carbon tetrafluoride (CF$_4$) gas, or an argon (Ar) gas, or a mixed gas containing these is used.

Figure 7:
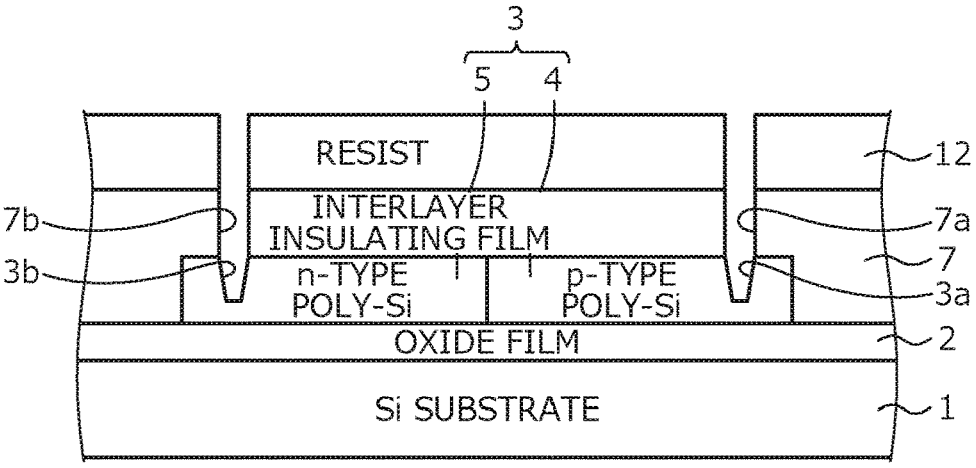
FIG. 7 is a cross-sectional view depicting a state of the semiconductor device according to the first embodiment during manufacture.

Next, as depicted in FIG. 7, the polysilicon layer 3 is etched using the resist mask 12, whereby the contact trenches 3a, 3b are formed in the polysilicon layer 3 (sixth process). In the etching of the polysilicon layer 3, for example, a carbon tetrafluoride (CF$_4$) gas, a chlorine-based gas such chlorine gas (Cl$_2$), nitrogen gas (N$_2$), or oxygen gas (O$_2$), or a mixed gas containing these is used. While the etching of the polysilicon layer 3 may be performed using the same etching equipment as that in the etching of the interlayer insulating film 7, preferably, the etching of the polysilicon layer 3 may be performed using etching equipment different from that for the etching of the interlayer insulating film 7.

Figure 8:
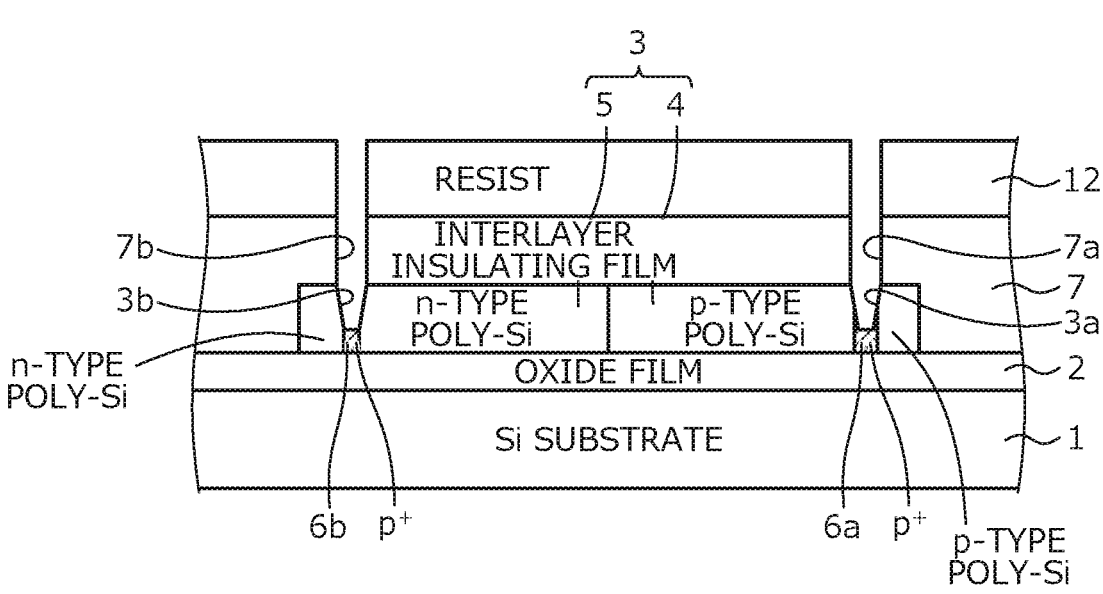
FIG. 8 is a cross-sectional view depicting a state of the semiconductor device according to the first embodiment during manufacture.

Next, as depicted in FIG. 8, a p-type impurity is ion-implanted using the resist mask 12 (seventh process). As a result, the p-type impurity concentration of the polysilicon layer 3 (the p-type anode region 4), which is of a p-type, is high at the bottom of the contact trench 3a, thereby forming the p$^+$-type region 6a at the bottom of the contact trench 3a. The p$^+$-type region 6a suffices to be formed at the bottom of the contact trench 3a and a thickness of the p$^+$-type region 6a may be thin. In addition, the polysilicon layer 3 (the n-type cathode region 5), which is of an n-type, is inverted to a p-type at the bottom of the contact trench 3b, thereby forming the p$^+$-type region 6b at the bottom of the contact trench 3b.

In an instance in which the cross-sectional shape of the contact trench 3a is a tapered shape, the p-type impurity is further ion-implanted at the sidewalls of the contact trench 3a, thereby facilitating formation of the p$^+$-type region 6a in the polysilicon layer 3, which is of a p-type, and along the sidewalls of the contact trench 3a from the bottom of the contact trench 3a. An ion-implantation amount of the p-type impurity to the sidewalls of the contact trench 3a is relatively low as compared to the ion-implantation amount of the p-type impurity to the bottom of the contact trench 3a and thus, a thickness (thickness from the sidewalls) of portions of the p$^+$-type region 6a along the sidewalls of the contact trench 3a is less than a thickness of a portion of the p$^+$-type region 6a along the bottom of the contact trench 3a.

In an instance in which the cross-sectional shape of the contact trench 3b is a tapered shape, while ion-implantation of the p-type impurity to the sidewalls of the contact trench 3b is also facilitated, even when the p-type impurity is ion-implanted to the sidewalls of the contact trench 3b, the n-type impurity concentration of the polysilicon layer 3 (the n-type cathode region 5), which is of an n-type, is of a level such that the n-type impurity concentration at the sidewalls of the contact trench 3b is slightly reduced. Thus, even when the p-type impurity is ion-implanted to the sidewalls of the contact trench 3b, the p$^+$-type region 6b is formed only at the bottom of the contact trench 3b and not at the sidewalls of the contact trench 3b. Subsequently, the resist mask 12 is removed (eighth process).

The resist mask 12 may be removed before the formation of the contact trenches 3a, 3b. In this instance, formation of the contact trenches 3a, 3b (etching process) and formation of the p$^+$-type regions 6a, 6b (ion implantation process) are performed using the interlayer insulating film 7 as a mask. While the interlayer insulating film 7 is also etched during the formation of the contact trenches 3a, 3b, etching conditions of the polysilicon layer 3 are set as conditions with a high selection ratio with the interlayer insulating film 7, whereby decreases in the thickness of the interlayer insulating film 7 may be suppressed. The resist mask 12 may be removed before the formation of the p$^+$-type regions 6a, 6b and the p$^+$-type regions 6a, 6b may be formed using the interlayer insulating film 7 as a mask.

In this manner, the p$^+$-type region 6a, which constitutes the p$^+$-type anode contact region, is formed in the p-type anode region 4, using the resist mask 12 or the interlayer insulating film 7 as a mask. The p$^+$-type region 6a is formed at the bottom of the contact trench 3a, which is connected to the contact hole 7a, and in the p-type anode region 4, a low-resistance contact with the anode electrode 8 is formed at a deep position toward the semiconductor substrate 1. Similarly to the contact trench 3a of the p-type anode region 4, in the n-type cathode region 5 as well, the contact trench 3b, which reaches a deep position toward the semiconductor substrate 1, is formed in the n-type cathode region 5 and is connected to the contact hole 7b.

The contact holes 7a, 7b expose the p-type anode region 4 and the n-type cathode region 5, so when the p⁺-type region 6a is formed, the p⁺-type region 6a is formed in the p-type anode region 4 and the p⁺-type region 6b is formed in the n-type cathode region 5. The p⁺-type region 6b in the n-type cathode region 5 is formed only at the bottom of the contact trench 3b and the n-type cathode region 5 is exposed at the sidewalls of the contact trench 3b. Thus, a contact between the cathode electrode 9 and the n-type cathode region 5 may be formed at each of the sidewalls of the contact trench 3b, and the diode 11 is formed by the pn junction between the p-type anode region 4 and the n-type cathode region 5.

For example, in the conventional method (refer to FIGS. 27 to 33), from the formation of the contact holes 107a, 107b of the interlayer insulating film 107, to the formation of the p⁺-type anode contact region 106, 2 resist masks (the resist masks 112, 113) are necessary. On the other hand, in the first embodiment, as described above, as compared to the conventional method, while the process of forming the contact trenches 3a, 3b is added, from the formation of the contact holes 7a, 7b of the interlayer insulating film 7, to the formation of the p⁺-type anode contact region (the p⁺-type region 6a), formation of one resist mask (the resist mask 12) suffices and compared to the conventional method, the number of sessions of the set of processes (depositing of a resist, pattern formation, and removal) for forming a resist mask may be reduced by one session.

Figure 15:
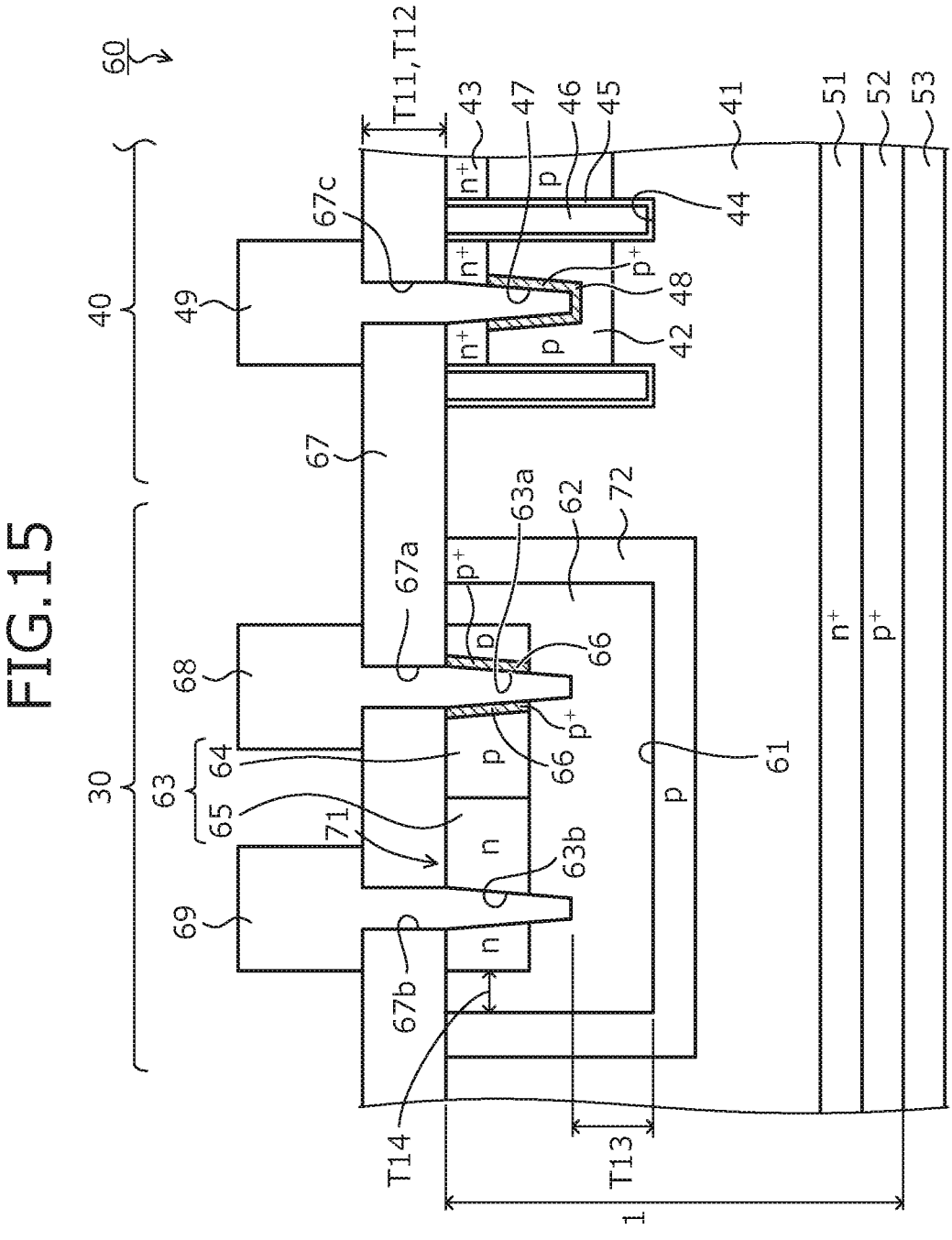
FIG. 15 is a cross-sectional view depicting a structure of a semiconductor device according to a fourth embodiment.

Further, the contact holes 7a, 7b, the contact trenches 3a, 3b, and the p⁺-type anode contact region (the p⁺-type region 6a) may be, respectively, formed concurrently with the contact holes, the contact trenches, and the p⁺-type contact regions of the non-depicted main semiconductor device disposed in a region different from that of the diode 11 (for example, refer to later-described FIGS. 10 and 15). Thus, in forming the described diode 11 on the single semiconductor substrate 1 in which the main semiconductor device is provided, no increase in manufacturing processes for forming the contact holes 7a, 7b, the contact trenches 3a, 3b, and the p⁺-type anode contact region (the p⁺-type region 6a) occurs.

Next, a metal electrode film is formed at the front surface of the semiconductor substrate 1 so as to be embedded in the contact holes 7a, 7b and the contact trenches 3a, 3b. The metal electrode film may be formed so that portions thereof embedded in the contact holes 7a, 7b and the contact trenches 3a, 3b may be a first metal material while a portion thereof protruding from the surface of the interlayer insulating film 7 is a second metal material different from the first metal material. The metal electrode film is patterned and portions thereof constituting the anode electrode 8 and the cathode electrode 9 are left (ninth process), whereby the semiconductor device 10 depicted in FIG. 1 is completed.

As described above, according to the first embodiment, the resist mask used in forming the contact holes of the interlayer insulating film or the interlayer insulating film is used as a mask to form the contact trenches of the polysilicon layer (p-type anode region and n-type cathode region) and the p⁺-type anode contact region. The contact trenches of the polysilicon layer are formed to be, respectively, connected to the contact holes for the respective contacts with the anode electrode and the cathode electrode. The p⁺-type anode contact region is formed at least at the bottom of the contact trench of the p-type anode region. By the p⁺-type anode contact region, a low-resistance contact may be formed with the anode electrode.

During formation of the p⁺-type anode contact region, the contact hole for the contact with the cathode electrode is exposed, whereby the p-type impurity is ion-implanted in the n-type cathode region as well, from the contact trench connected to the contact hole; however, the ion-implantation is to an extent that the p⁺-type region is formed at the bottom of the contact trench and the n-type cathode region (n-type polysilicon layer) is exposed at the sidewalls of the contact trench. Thus, the contact between the cathode electrode and the n-type cathode region may be formed at the sidewalls of the contact trench. As a result, the diode formed by the pn junction between the p-type anode region and the n-type cathode region formed by the polysilicon layer may be formed.

While a formation process for the contact trenches increases as compared to the conventional method, the same resist mask may be used to form the contact holes of the interlayer insulating film, the contact trenches of the polysilicon layer, and the p⁺-type anode contact region. Thus, from the formation of the contact holes of the interlayer insulating film, to the formation of the p⁺-type anode contact region, newly forming resist masks is unnecessary and as compared to the conventional method, the number of sessions of a set of processes (depositing of a resist, pattern formation, and removal) for the formation of a resist mask may be reduced by one session. Thus, the manufacturing cost may be reduced throughout the manufacturing process as compared to conventional methods, thereby enabling diodes to be formed at a lower cost.

Further, according to the first embodiment, in an instance in which the contact trenches are further formed in the main semiconductor device, the contact trenches of the diode may be formed concurrently with the contact trenches of the main semiconductor device. Newly adding processes for forming the contact trenches in the diode are unnecessary and thus, manufacturing cost may be further reduced. Further, according to the first embodiment, the diode functioning as a temperature sensor is disposed on the same semiconductor substrate as that of the main semiconductor device, whereby accurate measurement of the temperature of the main semiconductor device (semiconductor substrate) is possible, thereby enabling damage due to overheating of the main semiconductor device to be prevented.

Figure 9:
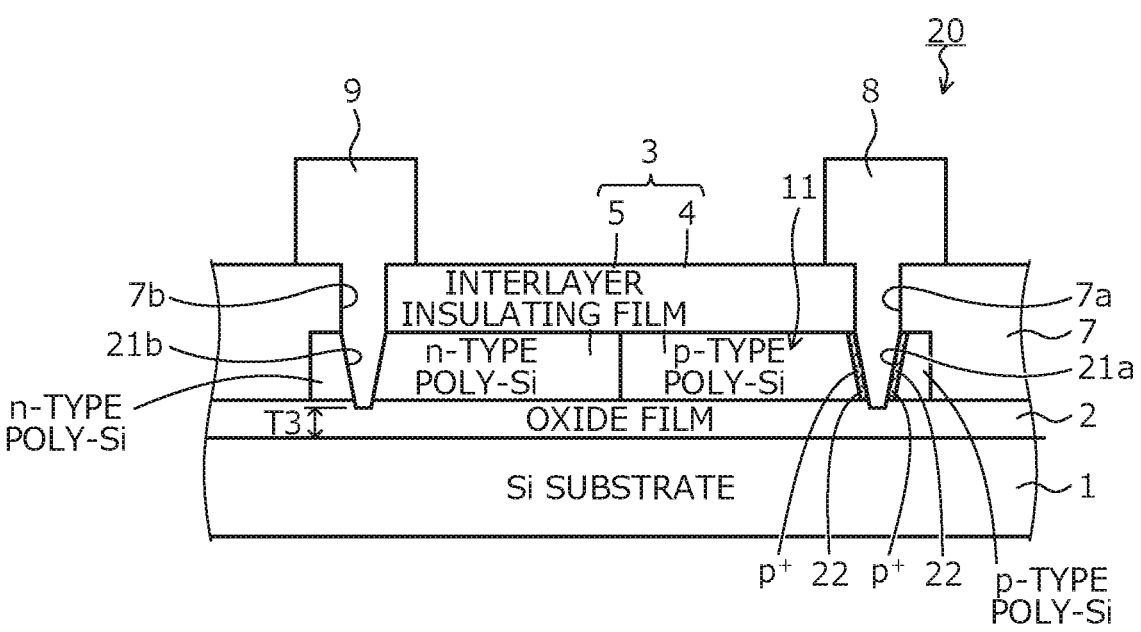
FIG. 9 is a cross-sectional view depicting a structure of a semiconductor device according to a second embodiment.

A structure of a semiconductor device according to a second embodiment is described. FIG. 9 is a cross-sectional view depicting the structure of the semiconductor device according to the second embodiment. A semiconductor device 20 according to the second embodiment differs from the semiconductor device 10 according to the first embodiment (refer to FIG. 1) on the following two points. A first difference is that contact trenches 21a, 21b formed in the polysilicon layer 3 (the p-type anode region 4 and the n-type cathode region 5) have depths that reach the field oxide film 2 beneath the polysilicon layer 3. A second difference is that the p⁺-type region is not formed in the n-type cathode region 5.

In particular, the contact trenches 21a, 21b penetrate through the polysilicon layer 3 in the depth direction and reach the field oxide film 2. A thickness T3 of the field oxide film 2 left between the bottoms of the contact trenches 21a, 21b and the semiconductor substrate 1 suffices to a be a thickness that may electrically insulate the polysilicon layer 3 and the semiconductor substrate 1; and the contact trenches 21a, 21b may terminate in the field oxide film 2. A depth of the contact trenches 21a, 21b is set to be deep, whereby latch-up withstanding capability may be enhanced.

The contact trenches 21a, 21b are connected to the contact holes 7a, 7b in the depth direction, respectively. In a cross-sectional view of the semiconductor device 20, a cross-sectional shape of each of the contact trenches 21a, 21b has to be tapered such that the width gradually decreases in a direction from the opening thereof to the bottom thereof. The field oxide film 2 is exposed at the bottoms of the contact trenches 21a, 21b. A $p^+$-type region (first first-conductivity-type high-concentration region) 22 (hatched portions) is provided in an entire area of each exposed surface of the p-type anode region 4 (the polysilicon layer 3 of a p-type) at the sidewalls of the contact trench 21a.

The $p^+$-type regions 22 are in contact with the p-type anode region 4 and are exposed at the sidewalls of the contact trench 21a, respectively. The $p^+$-type regions 22 may be formed in an entire area of the surface of each of the sidewalls of the contact trench 21a. In the cross-sectional view of the semiconductor device 20, a cross-sectional shape of the contact trench 21a has to have a tapered shape in which the sidewalls thereof are inclined, thereby, widening the opening of the contact trench 21a to an extent that a p-type impurity for forming the $p^+$-type regions 22 is assuredly ion-implanted in the sidewalls of the contact trench 21a. Each of the $p^+$-type regions 22 is the $p^+$-type anode contact region and has a function of reducing the resistance of the contact between the $p^+$-type region 22 and the anode electrode 8.

The contact trench 21b, similarly to the first embodiment, is formed concurrently with the contact trench 21a and in the cross-sectional view of the semiconductor device 20, has a same cross-sectional shape as that of the contact trench 21a. A periphery of the contact trench 21b is surrounded by the n-type cathode region 5. At the sidewalls of the contact trench 21b, the n-type cathode region 5 is exposed. During the formation of the $p^+$-type regions 22, while a p-type impurity is further ion-implanted in the sidewalls of the contact trench 21b, the n-type cathode region 5 (the polysilicon layer 3 of an n-type) maintains the n-type conductivity thereof.

The anode electrode 8 is embedded in the contact hole 7a and the contact trench 21a. The anode electrode 8 forms a low-resistance contact with each of the $p^+$-type regions 22 at the sidewalls of the contact trench 21a and is electrically connected to the p-type anode region 4 via the $p^+$-type regions 22. The cathode electrode 9 is embedded in the contact hole 7b and the contact trench 21b. The cathode electrode 9 forms a contact with the n-type cathode region 5 at the sidewalls of the contact trench 21b.

In this manner, even when the contact trenches 21a, 21b that penetrate through the polysilicon layer 3 in the depth direction and reach the field oxide film 2 are provided, the $p^+$-type regions 22 are formed only at the sidewalls of the contact trench 21a, whereby, similarly to the first embodiment, the diode 11 is formed by the pn junction between the p-type anode region 4 and the n-type cathode region 5. During the formation of the $p^+$-type regions 22, while a p-type impurity is further ion-implanted in the field oxide film 2 from the bottoms of the contact trenches 21a, 21b, insulation characteristics of the field oxide film 2 are not adversely affected.

A method of manufacturing the semiconductor device 20 according to the second embodiment suffices to include, in the method of manufacturing the semiconductor device 10 according to the first embodiment (refer to FIGS. 2 to 8), using the resist mask 12 (refer to FIG. 7) for forming the contact holes 7a, 7b or using the interlayer insulating film 7 as a mask and forming the contact trenches 21a, 21b, which have a tapered cross-sectional shape, in the p-type anode region 4 and the n-type cathode region 5, respectively; each of the contact trenches 21a, 21b penetrates through the polysilicon layer 3 in the depth direction and reaches the field oxide film 2.

As described above, according to the second embodiment, even in an instance in which contact trenches that, in the depth direction, penetrate through the polysilicon layer that forms the diode are formed, effects similar to those of the first embodiment may be obtained.

As a semiconductor device according to a third embodiment, in the semiconductor device 10, 20 according to the first and second embodiments, respectively (refer to FIGS. 1 and 9), a structure of the main semiconductor device fabricated (manufactured) together with the diode 11 in the semiconductor substrate 1 is described. FIG. 10 is a cross-sectional view depicting the structure of the semiconductor device according to the third embodiment. Here, a region in which the diode 11 having the contact trenches 21a, 21b of the second embodiment (refer to FIG. 9) is disposed is regarded as a diode region 30. In the diode region 30, instead of the diode 11 according to the second embodiment, the diode 11 having the contact trenches 3a, 3b of the first embodiment (refer to FIG. 1) may be disposed.

Figure 10:
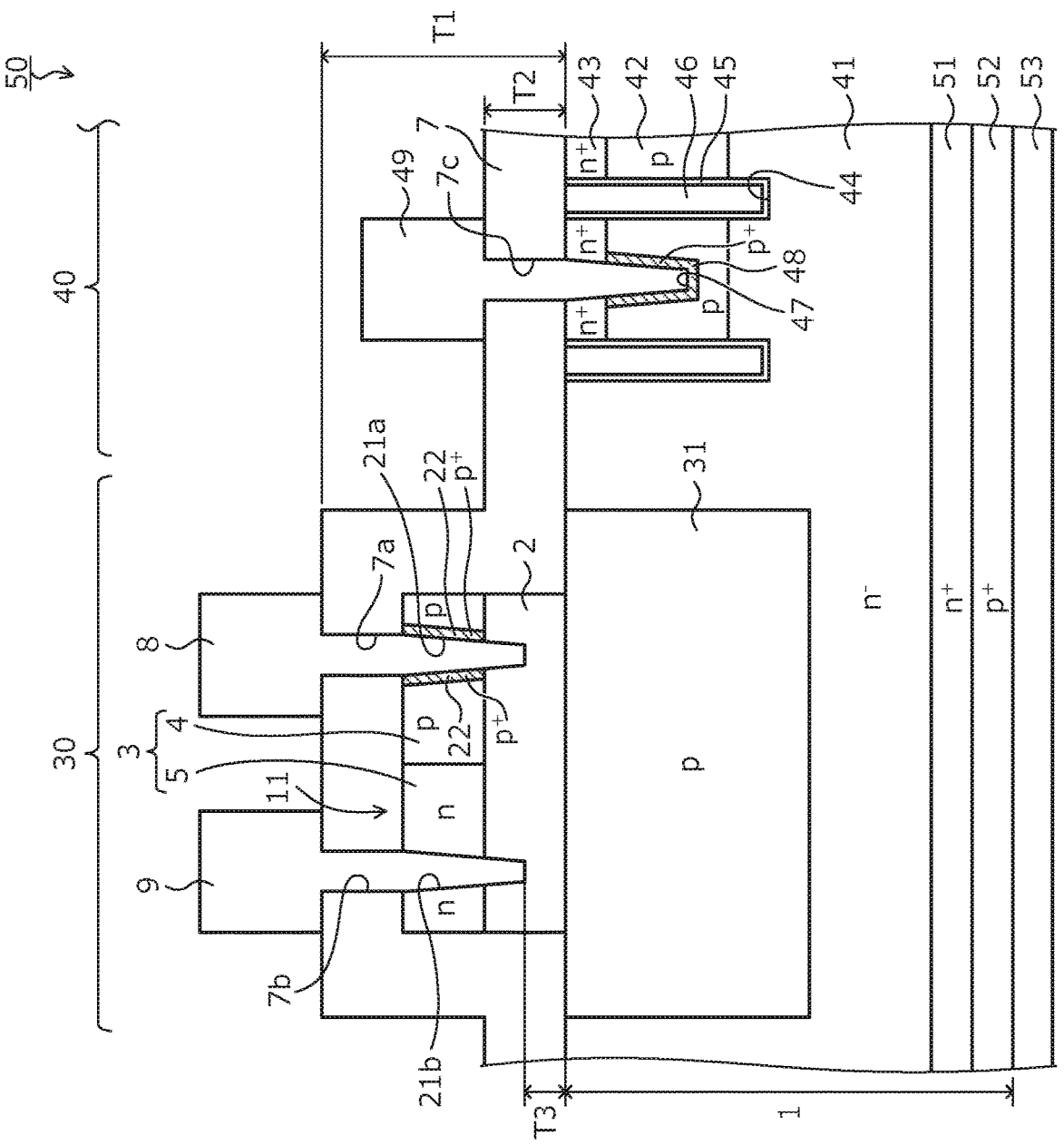
FIG. 10 is a cross-sectional view depicting a structure of a semiconductor device according to a third embodiment.

A semiconductor device 50 according to the third embodiment depicted in FIG. 10 has, in an active region 40 of the semiconductor substrate 1, as the main semiconductor device, for example, an IGBT and has the diode 11 in the diode region 30 of the semiconductor substrate 1. The semiconductor substrate 1 has, for example, an $n^-$-type conductivity and constitutes an $n^-$-type drift region (second semiconductor region) 41 of the IGBT. The $n^-$-type drift region 41 is provided spanning a center of the semiconductor substrate 1 to an end of the semiconductor substrate 1. The active region 40 is a region through which a main current (drift current) flows when the IGBT is in an on-state and in which multiple unit cells (functional units of the device) each having a same IGBT structure are disposed adjacently to one another.

An edge termination region (not depicted) having a predetermined voltage withstanding structure is between the active region 40 and the end of the semiconductor substrate 1. The edge termination region surrounds a periphery of the active region 40 and has a function of sustaining a breakdown voltage by mitigating electric field in a vicinity of a border between the active region and the edge termination region. The breakdown voltage is an upper voltage limit at which no malfunction or destruction of the device occurs. The diode region 30 may be provided in the edge termination region, may be provided between the active region 40 and the edge termination region, or may be provided surrounding the periphery of the active region 40. The diode region 30 is free of unit cells of the IGBT.

In the diode region 30, between the front surface of the semiconductor substrate 1 and the $n^-$-type drift region 41, a p-type region 31 is provided apart from the trench gate structure of the IGBT of the active region 40 and the voltage withstanding structure of the edge termination region. An upper surface (front surface of the semiconductor substrate 1) of the p-type region 31 is covered by the field oxide film 2 and the interlayer insulating film 7. The p-type region 31 has a function of equalizing electric field in a plane of the front surface of the semiconductor substrate 1, in the diode region 30. A thickness of the p-type region 31 (depth from the front surface of the semiconductor substrate 1) is substantially equal to a thickness (for example, about 8 μm) of a p-type region configuring the voltage withstanding structure of the edge termination region.

In the diode region 30, similarly to the second embodiment, the diode 11 formed by the polysilicon layer 3 is provided on the front surface of the semiconductor substrate 1. An entire area of the polysilicon layer 3 faces the p-type region 31 in the depth direction, via the field oxide film 2. The polysilicon layer 3 is electrically insulated from the active region 40 and the edge termination region by the field oxide film 2 and the interlayer insulating film 7. Configuration of the diode 11 (the polysilicon layer 3), the contact trenches 21a, 21b, the $p^+$-type regions 22, the contact holes 7a, 7b, the anode electrode 8, and the cathode electrode 9 is the same as that in the second embodiment.

The interlayer insulating film 7 is provided having a uniform thickness in an entire area of the front surface of the semiconductor substrate 1 and covers the polysilicon layer 3 and later-described gate electrodes 46. The polysilicon layer 3 (the diode 11) is provided on the front surface of the semiconductor substrate 1, whereby a height T1 from the front surface of the semiconductor substrate 1 in the diode region 30, to the upper surface (uppermost surface, or interface with a passivation film) of the interlayer insulating film 7 is, for example, about 5000 nm higher than a height T2 from the front surface of the semiconductor substrate 1 in the active region 40, to the upper surface of the interlayer insulating film 7. At the upper surface of the interlayer insulating film 7, a step is formed at the border between the diode region 30 and the active region 40.

In the active region 40, the trench gate structure of the IGBT is provided between the front surface of the semiconductor substrate 1 and the $n^-$-type drift region 41. The trench gate structure of the IGBT is configured by a p-type base region (first semiconductor region) 42, an $n^+$-type emitter region 43, a contact trench (third contact trench) 47, a $p^+$-type emitter contact region (third first-conductivity-type high-concentration region) 48 (hatched portion), gate trenches 44, gate insulating films 45, and the gate electrodes 46.

The p-type base region 42 is provided in the active region 40, between the front surface of the semiconductor substrate 1 and the $n^-$-type drift region 41 but apart from the p-type region 31. A depth position of a lower surface (surface facing a $p^+$-type collector region 52) of the p-type base region 42 is, for example, closer to the $n^+$-type emitter region 43 than is a lower surface of the p-type region 31. The $n^+$-type emitter region 43 is selectively provided between the front surface of the semiconductor substrate 1 and the p-type base region 42.

The gate trenches 44 penetrate through the $n^+$-type emitter region 43 and the p-type base region 42 in the depth direction and reach the $n^-$-type drift region 41. The gate electrodes 46 are provided, respectively, in the gate trenches 44, via the gate insulating films 45, respectively. The upper surface (surface at the opening of each of the gate trenches 44) of each of the gate electrodes 46 is covered by the interlayer insulating film 7. Between the gate trenches 44 that are adjacent to one another, the contact trench 47 is provided apart from the gate trenches 44.

The contact trench 47 penetrates through the $n^+$-type emitter region 43 in the depth direction and terminates in the p-type base region 42. The contact trench 47 is connected to a later-described contact hole (third contact hole) 7c in the depth direction. The contact trench 47 has, at a portion thereof connected to the contact hole 7c (interface between the semiconductor substrate 1 and the interlayer insulating film 7), a width that is substantially equal to a width of the contact hole 7c. The contact trench 47 is formed concurrently with the contact trenches 21a, 21b of the diode 11 and in the cross-sectional view of semiconductor device 50, has a cross-sectional shape and a depth that are substantially equal to those of the contact trenches 21a, 21b. The $n^+$-type emitter region 43 is exposed at the sidewalls of the contact trench 47, at the opening of the contact trench 47.

The $p^+$-type emitter contact region 48 is provided between the contact trench 47 and the p-type base region 42. The $p^+$-type emitter contact region 48 is in contact with the p-type base region 42 and the $n^+$-type emitter region 43 and is exposed at least at the bottom of the contact trench 47. For example, in an instance in which the contact trench 47 has a cross-sectional shape that is substantially rectangular, the $p^+$-type emitter contact region 48 is exposed only at the bottom of the contact trench 47. In an instance in which the contact trench 47 has a cross-sectional shape that is tapered, the $p^+$-type emitter contact region 48 is exposed at the bottom of the contact trench 47 and the inner wall of the contact trench 47. The $p^+$-type emitter contact region 48 is formed concurrently with the $p^+$-type anode contact region (the $p^+$-type regions 22) of the diode 11.

In the active region 40, the contact hole 7c is provided in the interlayer insulating film 7 that covers the front surface of the semiconductor substrate 1. Between the gate trenches 44 that are adjacent to one another, the contact hole 7c penetrates through the interlayer insulating film 7 in the depth direction. The contact hole 7c is formed concurrently with the contact holes 7a, 7b of the diode region 30. The contact trench 47 of the main semiconductor device (IGBT) is exposed in the contact hole 7c.

The emitter electrode (third electrode) 49 is embedded in the contact hole 7c and the contact trench 47. The emitter electrode 49 is in contact with the $n^-$-type emitter region 43 and the $p^+$-type emitter contact region 48 at the inner wall of the contact trench 47. The emitter electrode 49 forms a low-resistance contact with the $p^+$-type emitter contact region 48 at the inner wall of the contact trench 47. The emitter electrode 49 is electrically connected to the p-type base region 42, via the $p^+$-type emitter contact region 48. The emitter electrode 49 is formed concurrently with the anode electrode 8 and the cathode electrode 9 of the diode 11.

Between the back surface of the semiconductor substrate 1 and the $n^-$-type drift region 41, a $p^+$-type contact region 52 is provided in an entire area of the back surface of the semiconductor substrate 1. Between the back surface of the semiconductor substrate 1 and the $n^-$-type drift region 41, an $n^+$-type buffer region 51 is provided at a position closer to the $n^+$-type emitter region 43 from the back surface of the semiconductor substrate 1 than is the $p^+$-type contact region 52. The $n^+$-type buffer region 51 may be in contact with the $p^+$-type contact region 52, may be apart from the $p^+$-type contact region 52, or the $n^-$-type drift region 41 may be between the $n^+$-type buffer region 51 and the $p^+$-type contact region 52. A contact electrode (fourth electrode) 53 is in contact with an entire area of the $p^+$-type contact region 52, at the back surface of the semiconductor substrate 1.

Figure 11:
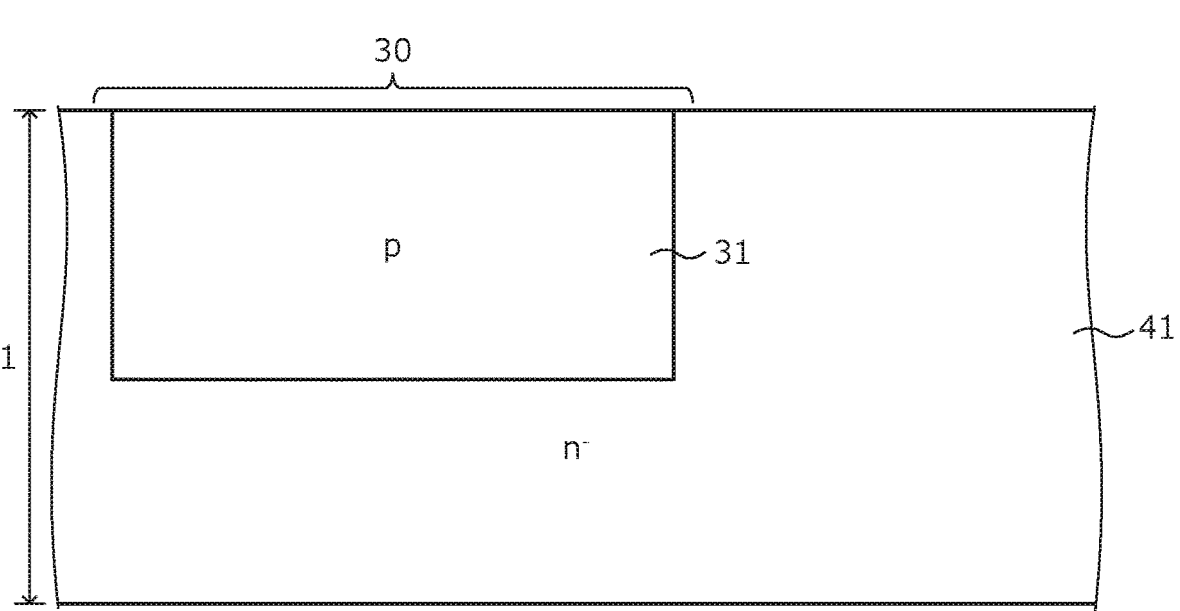
FIG. 11 is a cross-sectional view depicting a state of the semiconductor device according to the third embodiment during manufacture.

Next, a method of manufacturing the semiconductor device 50 according to the third embodiment is described with reference to FIGS. 11 to 14. FIGS. 11, 12, 13, and 14 are cross-sectional views depicting states of the semiconductor device according to the third embodiment during manufacture. First, as depicted in FIG. 11, in substantially an entire area of the diode region 30, the p-type region 31 is formed by ion-implantation of a p-type impurity, in the semiconductor substrate 1, at the front surface of the semiconductor substrate 1, which is of an n⁻-type. The p-type region 31, for example, is formed concurrently with a p-type region configuring the voltage withstanding structure of the edge termination region.

Figure 12:
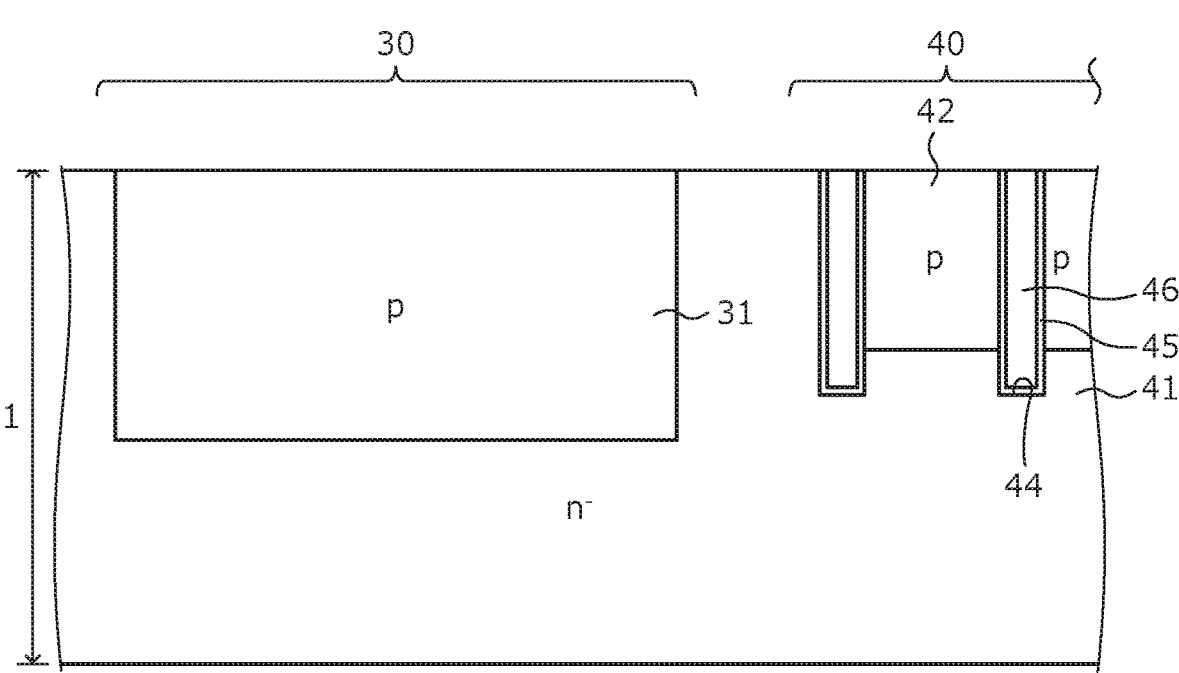
FIG. 12 is a cross-sectional view depicting a state of the semiconductor device according to the third embodiment during manufacture.

Next, as depicted in FIG. 12, in substantially an entire area of the active region 40, the p-type base region 42 is formed in the semiconductor substrate 1, at the front surface thereof by ion-implantation of a p-type impurity. Next, the gate trenches 44 that penetrate through the p-type base region 42 in the depth direction and reach the n⁻-type drift region 41 (portion of the semiconductor substrate 1 closer to the back surface of the semiconductor substrate 1 than is the p-type base region 42) are formed by etching. Next, the gate electrodes 46 are formed, respectively, in the gate trenches 44, via the gate insulating films 45, respectively.

Figure 13:
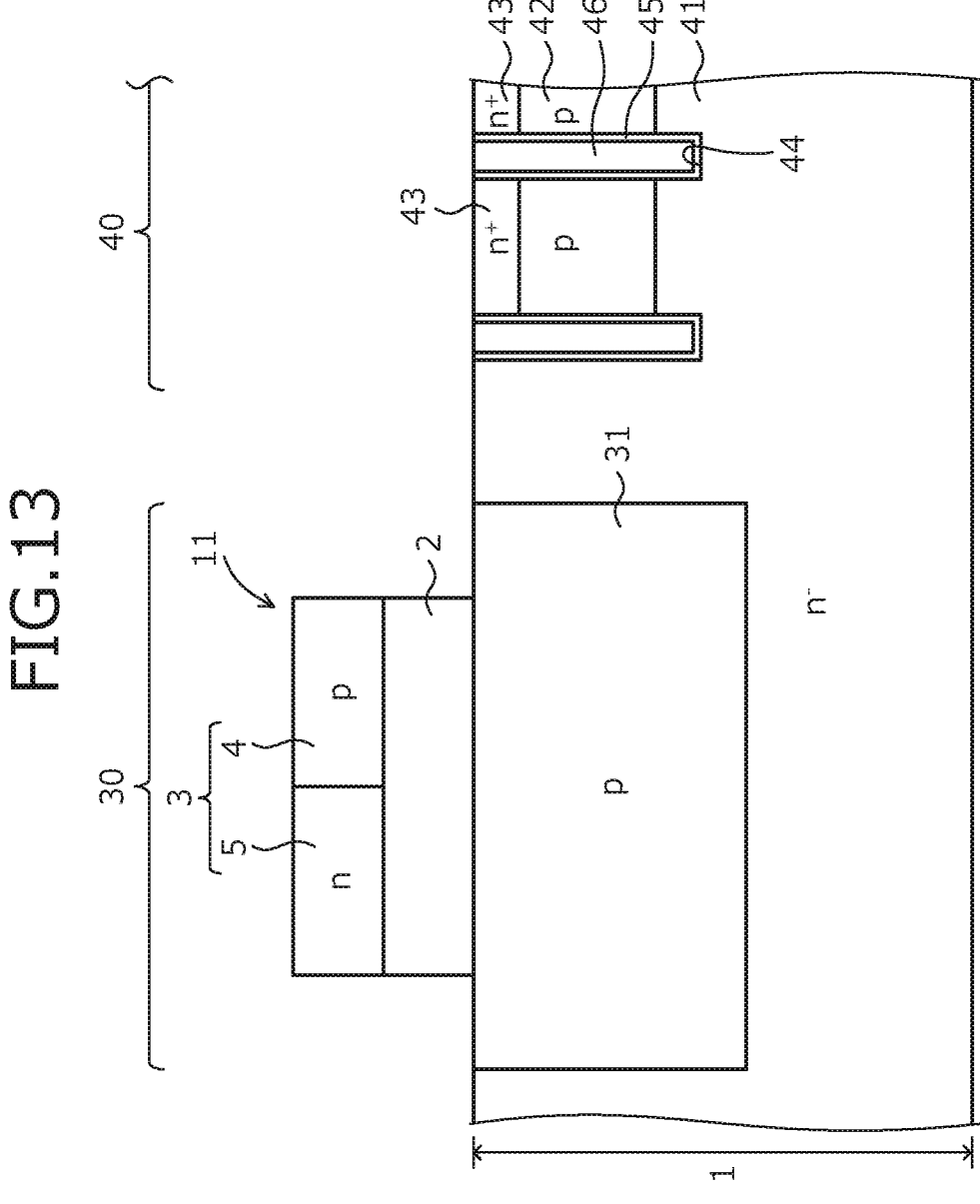
FIG. 13 is a cross-sectional view depicting a state of the semiconductor device according to the third embodiment during manufacture.

Next, as depicted in FIG. 13, in the p-type base region 42, at the surface thereof, the n⁺-type emitter region 43 is formed in contact with the gate insulating films 45 at the sidewalls of the gate trenches 44, by ion-implantation of an n-type impurity. Next, similarly to the second embodiment, on the front surface of the semiconductor substrate 1, the diode 11 that is formed by the polysilicon layer 3 (the p-type anode region 4 and the n-type cathode region 5) is formed facing the p-type region 31 in the depth direction and the field oxide film 2 intervenes therebetween. The n⁺-type emitter region 43 and the n-type cathode region 5 may be formed concurrently.

Figure 14:
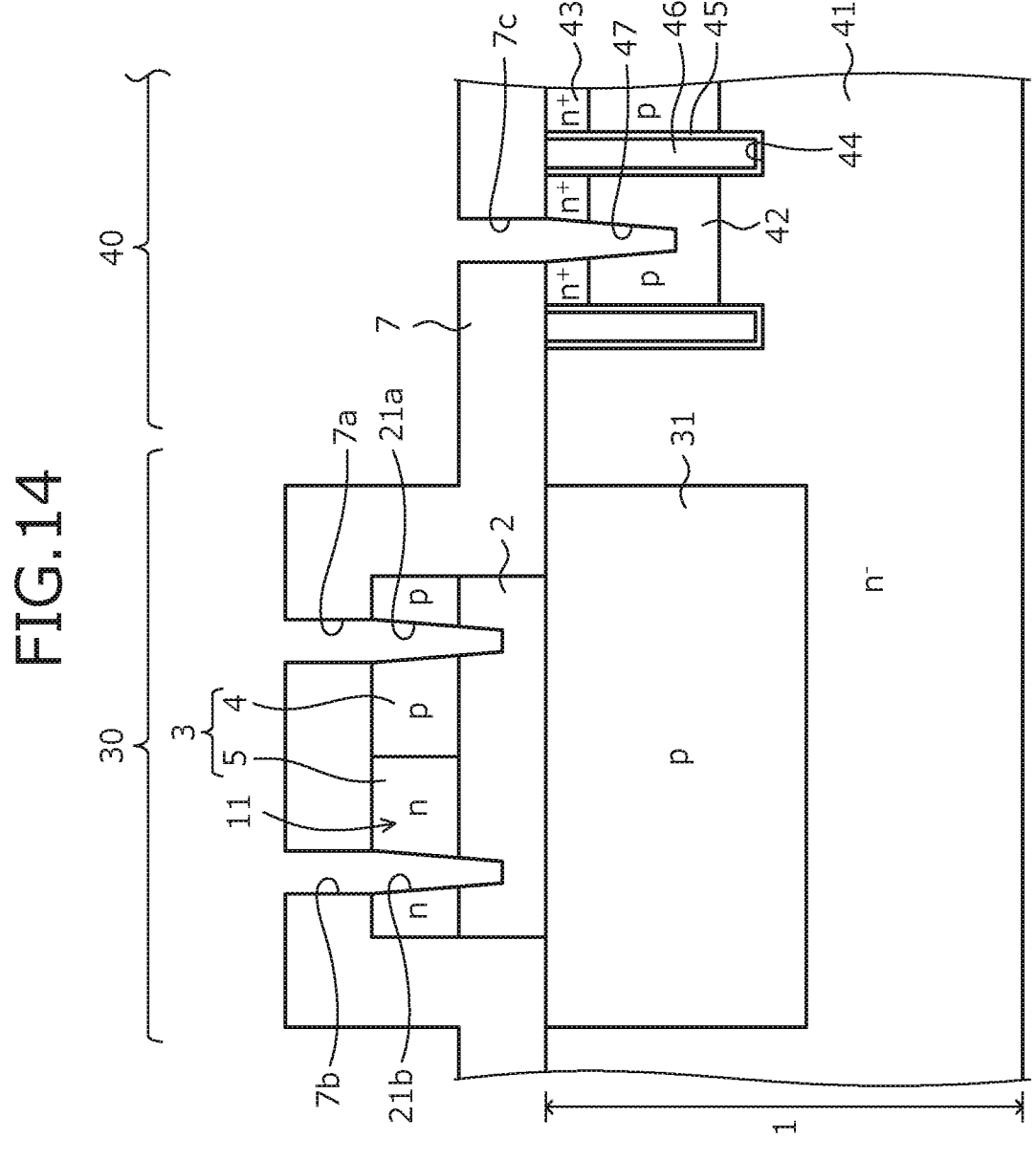
FIG. 14 is a cross-sectional view depicting a state of the semiconductor device according to the third embodiment during manufacture.

Next, as depicted in FIG. 14, the interlayer insulating film 7 is formed in an entire area of the front surface of the semiconductor substrate 1 and covers the polysilicon layer 3 and the gate electrodes 46. Next, similarly to the second embodiment, the contact holes 7a, 7b are formed in the interlayer insulating film 7 in the diode region 30. The contact holes 7a, 7b suffice to be formed concurrently with the contact hole 7c of the active region 40. In each of the contact holes 7a, 7b, 7c, the p-type anode region 4, the n-type cathode region 5, and the n⁺-type emitter region 43 are each exposed.

Next, similarly to the second embodiment, the contact trenches 21a, 21b are formed in the polysilicon layer 3 (the p-type anode region 4 and the n-type cathode region 5). The contact trenches 21a, 21b suffice to be formed concurrently with the contact trench 47 of the active region 40. The p-type anode region 4 and the n-type cathode region 5 are exposed, respectively, at the sidewalls of the contact trenches 21a, 21b. The n⁺-type emitter region 43 and the p-type base region 42 are exposed at the inner wall of the contact trench 47.

Next, similarly to the second embodiment, the p⁺-type regions 22 are formed in the p-type anode region 4. The p⁺-type regions 22 suffice to be formed concurrently with the p⁺-type emitter contact region 48 of the active region 40. Next, similarly to the second embodiment, the anode electrode 8 and the cathode electrode 9 are formed. The anode electrode 8 and the cathode electrode 9 suffice to be formed concurrently with the emitter electrode 49. Thereafter, at the back surface of the semiconductor substrate 1, the n⁺-type buffer region 51, the p⁺-type contact region 52, and the contact electrode 53 are formed, whereby the semiconductor device 50 depicted in FIG. 10 is completed.

The first embodiment (refer to FIG. 1) may be applied to the semiconductor device 50 according to the third embodiment and instead of the contact trenches 21a, 21b, the contact trenches 3a, 3b that terminated in the polysilicon layer 3 may be formed. In this instance, instead of the p⁺-type regions 22, similarly to the first embodiment, the p⁺-type regions 6a, 6b are formed. In addition, the cross-sectional shape of the contact trenches 3a, 3b may be substantially rectangular. The contact trench 47 of the main semiconductor device has substantially a same cross-sectional shape as that of the contact trenches 3a, 3b of the polysilicon layer 3.

As described above, according to the third embodiment, similarly to the first and second embodiments, the contact trenches of the diode and the contact trenches of the main semiconductor device may be formed concurrently.

A structure of a semiconductor device according to a fourth embodiment is described. FIG. 15 is a cross-sectional view depicting the structure of the semiconductor device according to the fourth embodiment. A semiconductor device 60 according to the fourth embodiment differs from the semiconductor device according to the third embodiment (refer to FIG. 10) in that, in the diode region 30, a diode 71 is embedded in the semiconductor substrate 1 so as to electrically isolate the main semiconductor device (the semiconductor substrate 1) of the active region 40. The configuration of the active region 40 is the same as that of the third embodiment.

In particular, in the fourth embodiment, in the diode region 30, at the front surface of the semiconductor substrate 1, a recess (hereinafter, recessed portion (first recess)) 61 of a predetermined depth is provided. A field oxide film (insulating film) 62 is provided along an inner wall of the recessed portion 61. In the recessed portion 61, the diode 71 is provided on the field oxide film 62. The diode 71 is a polysilicon diode formed in a polysilicon layer 63 by a pn junction between a p-type anode region 64 and an n-type cathode region 65.

Contact trenches 63a, 63b that penetrate the polysilicon layer 63 (the p-type anode region 64 and the n-type cathode region 65) in the depth direction and reach the field oxide film 62 are provided. The contact trenches 63a, 63b may terminate in the field oxide film 62. Between sidewalls of the contact trench 63a and the p-type anode region 64, p⁺-type regions (first first-conductivity-type high-concentration regions) 66 (hatched portions) are provided. The p⁺-type regions 66 and the n-type cathode region 65 are exposed at the sidewalls of the contact trenches 63a, 63b.

A thickness T13 of the field oxide film 62 left between the bottoms of the recessed portion 61 and the bottom of each of the contact trenches 63a, 63b suffices to be a thickness that enables electrical insulation between the polysilicon layer 63 and the semiconductor substrate 1 and depths of the contact trenches 63a, 63b and the recessed portion 61 may be suitably set. On sidewalls of the recessed portion 61, a thickness T14 of a portion of the field oxide film 62 present between the polysilicon layer 63 and a p-type region 72 suffices to be a thickness enabling electrical insulation between the polysilicon layer 63 and the semiconductor substrate 1 and a width of the recessed portion 61 may be suitably set.

An interlayer insulating film 67 is provided in an entire area of the front surface of the semiconductor substrate 1, has a uniform thickness, and covers the polysilicon layer 63 and the gate electrodes 46. The polysilicon layer 63 (the diode 71) is disposed in the recessed portion 61, whereby an upper surface (interface between the polysilicon layer 63 and the interlayer insulating film 67) of the polysilicon layer 63 is positioned at substantially a same height as that of the front surface (interface between the semiconductor substrate 1 and the interlayer insulating film 67) of the semiconductor substrate 1. In other words, the upper surface of the interlayer insulating film 67 is substantially flat in the entire area. A configuration of a contact hole 67c is a same as that of the contact hole 7c of the third embodiment.

Thus, a height T11 from the front surface of the semiconductor substrate 1 in the diode region 30, to the upper surface of the interlayer insulating film 67 is substantially equal to a height T12 from the front surface of the semiconductor substrate 1 in the active region 40, to the upper surface of the interlayer insulating film 67. In the interlayer insulating film 67 in the diode region 30, contact holes 67a, 67b that penetrate through the interlayer insulating film 67 in the depth direction are provided. The contact trenches 63a, 63b of the polysilicon layer 63 (the diode 71) are exposed in the contact holes 67a, 67b, respectively.

Configuration of the polysilicon layer 63, the p-type anode region 64, the n-type cathode region 65, the contact trenches 63a, 63b, the p$^+$-type regions 66, the contact holes 67a, 67b, an anode electrode 68, and a cathode electrode 69 is the same as that of the polysilicon layer 3, the p-type anode region 4, the n-type cathode region 5, the contact trenches 21a, 21b, the p$^+$-type regions 22, the contact holes 7a, 7b, the anode electrode 8, and the cathode electrode 9 of the third embodiment, excluding disposal of the polysilicon layer 63 (the diode 71) in the recessed portion 61.

Between the recessed portion 61 and the n$^-$-type drift region 41, the p-type region 72 is provided apart from the trench gate structure of the IGBT of the active region 40 and the voltage withstanding structure of the edge termination region (not depicted). The p-type region 72 surrounds a periphery of the recessed portion 61 and is exposed at the inner wall of the recessed portion 61. The p-type region 72 has a function of equalizing electric field of the front side of the semiconductor substrate 1 in the diode region 30.

A thickness of portions of the p-type region 72 along the sidewalls of the recessed portion 61 (thickness in a direction orthogonal to the sidewalls of the recessed portion 61) and a thickness of a portion of the p-type region 72 along the bottom of the recessed portion 61 (thickness in a direction orthogonal to the bottom of the recessed portion 61) may be different from each other. A depth of the p-type region 72 (depth from the front surface of the semiconductor substrate 1) is substantially equal to a depth of a p-type region configuring the voltage withstanding structure of the edge termination region (not depicted).

For example, when the depth of the p-type region 72 is shallow, while the breakdown voltage of the semiconductor device 60 decreases, in the fourth embodiment, without changing the depth of the p-type region 72, the diode 71 may be disposed facing the p-type region 72 in the depth direction in the semiconductor substrate 1 (in the recessed portion 61). While not particularly limited hereto, for example, the depth of the recessed portion 61 is about 1.5 μm and the depth of the p-type region 72 (depth from the front surface of the semiconductor substrate 1) is about 8 μm.

Figures 16, 17:
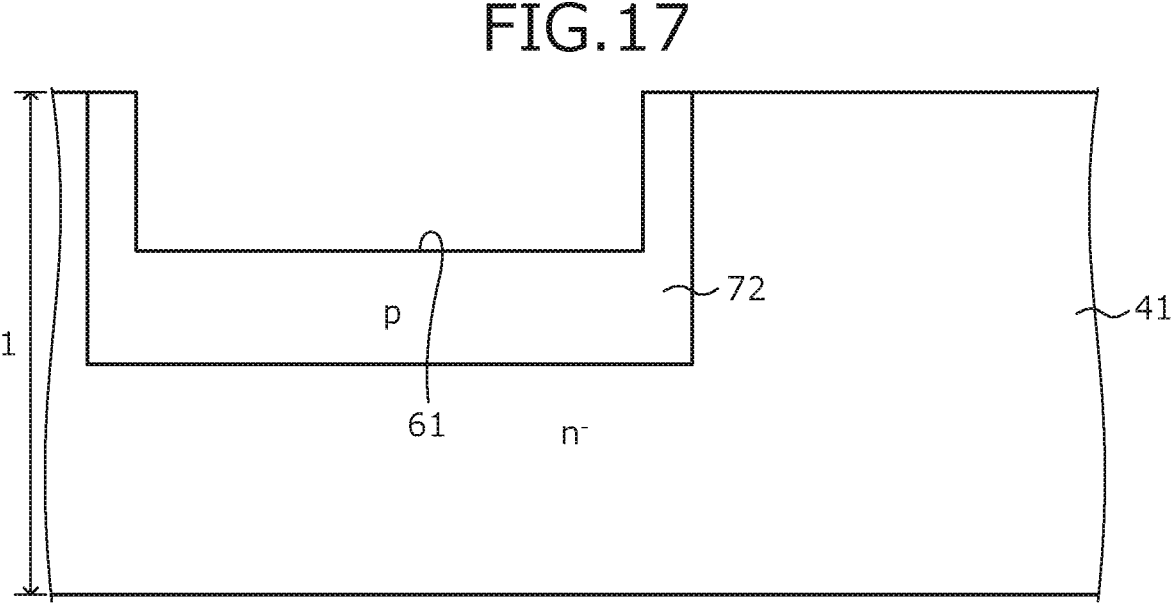
FIG. 16 is a cross-sectional view depicting a state of the semiconductor device according to the fourth embodiment during manufacture.
FIG. 17 is a cross-sectional view depicting a state of the semiconductor device according to the fourth embodiment during manufacture.

Next, a method of manufacturing the semiconductor device 60 according to the fourth embodiment is described. FIGS. 16, 17, 18, 19, 20, 21, 22, and 23 are cross-sectional views depicting states of the semiconductor device according to the fourth embodiment during manufacture. First, as depicted in FIG. 16, the recessed portion 61 is formed by etching, in the diode region 30, at the front surface of the semiconductor substrate 1, which is an n$^-$-type. Next, as depicted in FIG. 17, in the inner wall (sidewalls and bottom) of the recessed portion 61, at the surface thereof, the p-type region 72 is formed along the inner wall of the recessed portion 61 by ion-implantation of a p-type impurity.

Figures 18, 19:
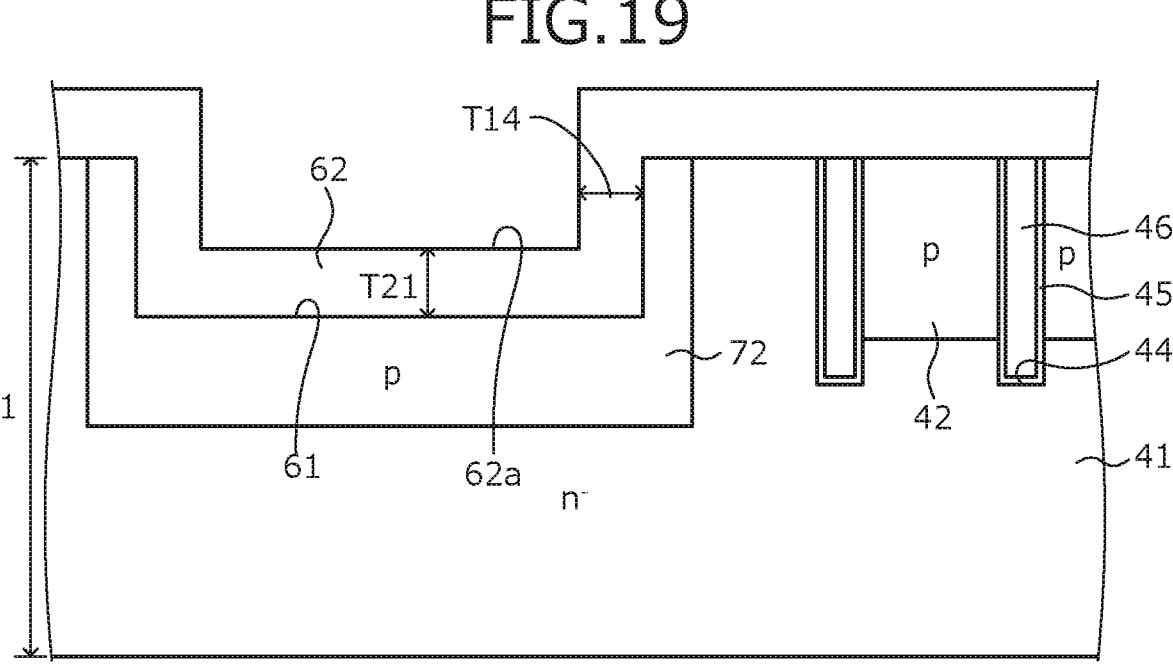
FIG. 18 is a cross-sectional view depicting a state of the semiconductor device according to the fourth embodiment during manufacture.
FIG. 19 is a cross-sectional view depicting a state of the semiconductor device according to the fourth embodiment during manufacture.

Next, as depicted in FIG. 18, similarly to the third embodiment, the p-type base region 42, the gate trenches 44, the gate insulating films 45, and the gate electrodes 46 are formed. The recessed portion 61 and the gate trenches 44 may be formed concurrently. Next, as depicted in FIG. 19, for example, the field oxide film 62 is formed along the front surface of the semiconductor substrate 1 and the inner wall of the recessed portion 61 by a chemical vapor deposition (CVD) method. The field oxide film 62 may be, for example, a high temperature oxide (HTO) film.

The field oxide film 62 is formed along the front surface of the semiconductor substrate 1 and the inner wall of the recessed portion 61 and has a uniform thickness. At this time, in the recessed portion 61, the field oxide film 62 is formed so that a recess (second recess) 62a is left on the field oxide film 62. The recess 62a has predetermined dimension (width and depth) enabling disposal of the diode 71. In addition, a thickness T21 of the field oxide film 62 on the bottom of the recessed portion 61 is a thickness that ensures that the field oxide film 62 is left having the predetermined thickness T13 (refer to FIG. 15) between the bottom of the recessed portion 61 and the bottoms of the contact trenches 63a, 63b formed at a subsequent process.

The field oxide film 62 has a portion on the front surface of the semiconductor substrate 1, portions on the sidewalls of the recessed portion 61, and a portion on the bottom of the recessed portion 61, all having substantially a same thickness. Thus, in the recessed portion 61, dimensions of the recessed portion 61 suffice to be suitably set so that the recess 62a having predetermined dimensions is left on the field oxide film 62 and the field oxide film 62 has a portion that is on the bottom of the recessed portion 61 and has the predetermined thickness T21. In FIGS. 16 to 23, the recessed portion 61 is depicted using an aspect ratio different from that in FIG. 15 and the portions of the field oxide film 62 on the sidewalls of the recessed portion 61 and the portion on the bottom of the recessed portion 61 have, respectively, the thicknesses T14, T21 that are equal.

Figure 20:
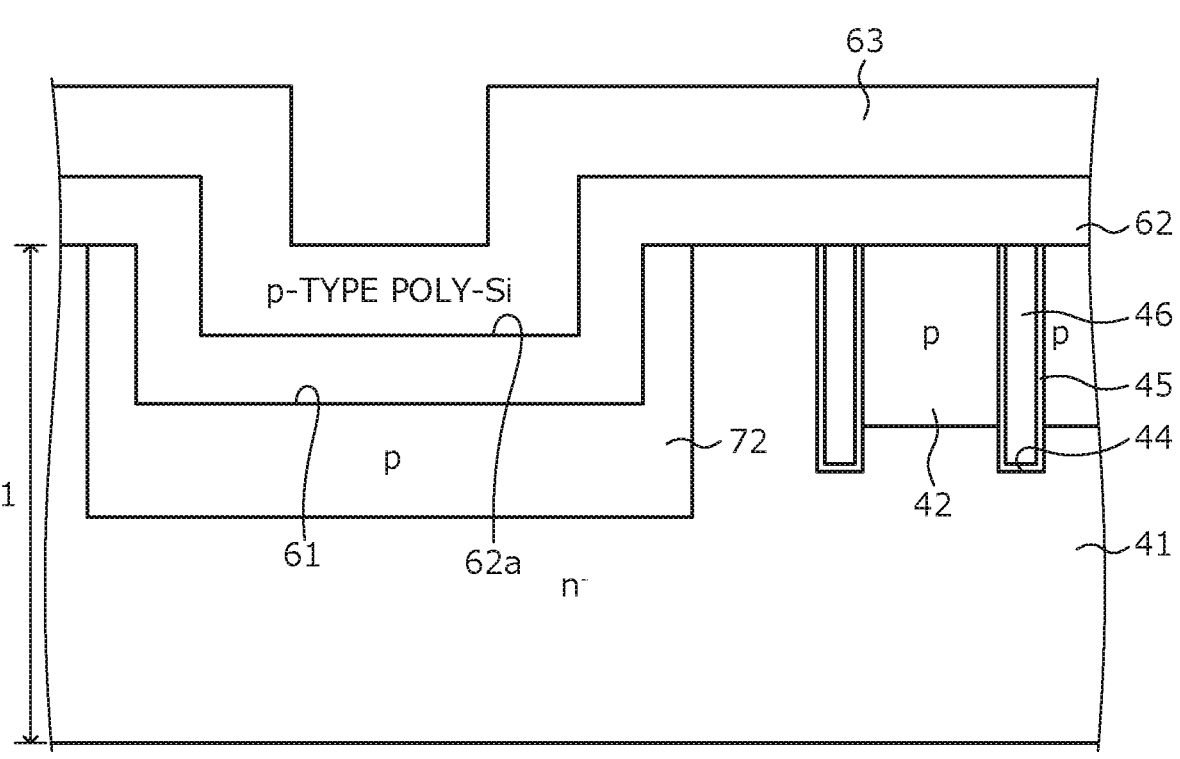
FIG. 20 is a cross-sectional view depicting a state of the semiconductor device according to the fourth embodiment during manufacture.
Figure 21:
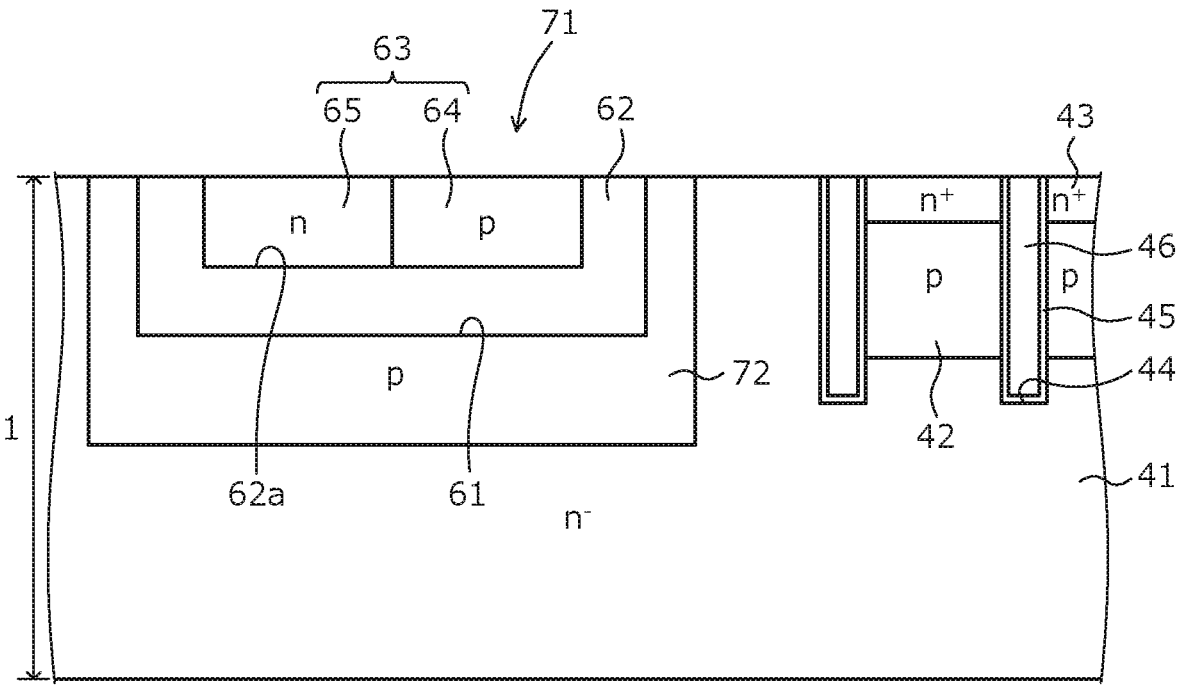
FIG. 21 is a cross-sectional view depicting a state of the semiconductor device according to the fourth embodiment during manufacture.

Next, as depicted in FIG. 20, the polysilicon layer 63 is deposited on the field oxide film 62 and in the recessed portion 61, the recess 62a left on the field oxide film 62 is completely embedded with the polysilicon layer 63. Further, the polysilicon layer 63 and the field oxide film 62 are etched, leaving portions thereof only in the recessed portion 61. Next, as depicted in FIG. 21, the diode 71 (the p-type anode region 64 and the n-type cathode region 65) is formed in the polysilicon layer 63. A method of forming the p-type anode region 64 and a method of forming the n-type cathode region 65 are the same as those, respectively, for forming the p-type anode region 4 and the n-type cathode region 5 of the third embodiment. Further, similarly to the third embodiment, the n$^+$-type emitter region 43 is formed in the active region 40.

Figure 22:
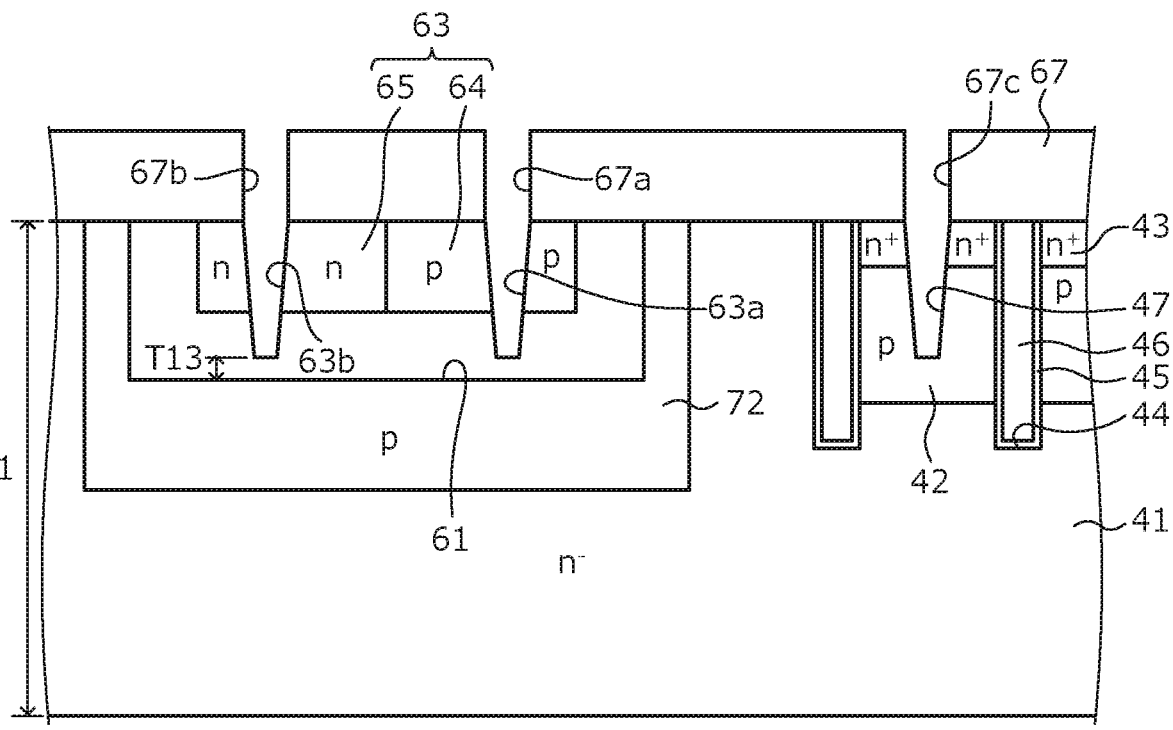
FIG. 22 is a cross-sectional view depicting a state of the semiconductor device according to the fourth embodiment during manufacture.

Next, as depicted in FIG. 22, the interlayer insulating film 67 is formed in an entire area of the front surface of the semiconductor substrate 1, the interlayer insulating film 67 covers the diode 71 and the gate electrodes 46. Next, similarly to the contact holes 7a, 7b, 7c of the third embodiment, the contact holes 67a, 67b, 67c are formed in the interlayer insulating film 67. Next, similarly to the contact trenches 21a, 21b of the third embodiment, the contact trenches 63a, 63b are formed in the polysilicon layer 63. Similarly to the third embodiment, the contact trench 47 is formed.

Figure 23:
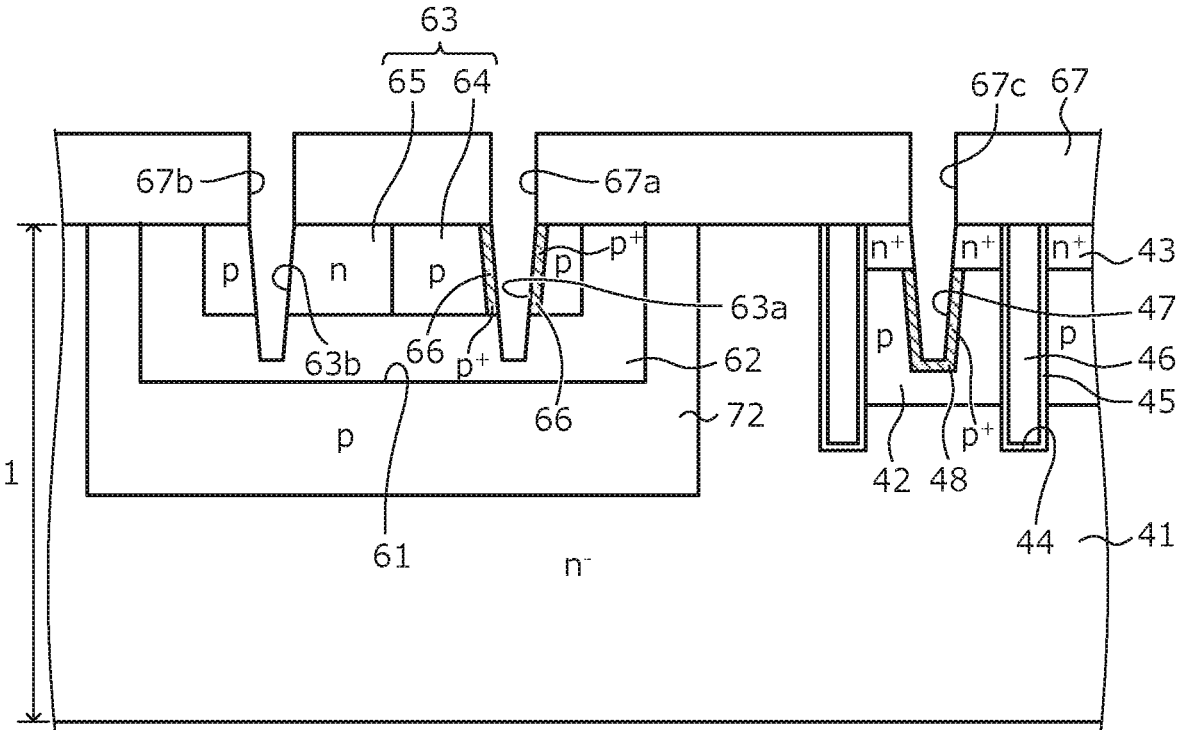
FIG. 23 is a cross-sectional view depicting a state of the semiconductor device according to the fourth embodiment during manufacture.

Next, as depicted in FIG. 23, similarly to the p⁺-type regions 22 of the third embodiment, the p⁺-type regions 66 are formed in the p-type anode region 64. Similarly to the third embodiment, the p⁺-type emitter contact region 48 is formed. Next, similarly to the anode electrode 8 and the cathode electrode 9 of the third embodiment, the anode electrode 68 and the cathode electrode 69 are formed and, similarly to the third embodiment, the emitter electrode 49, the n⁺-type buffer region 51, the p⁺-type contact region 52, and the contact electrode 53 are formed, whereby the semiconductor device 60 depicted in FIG. 15 is completed.

Figure 24:
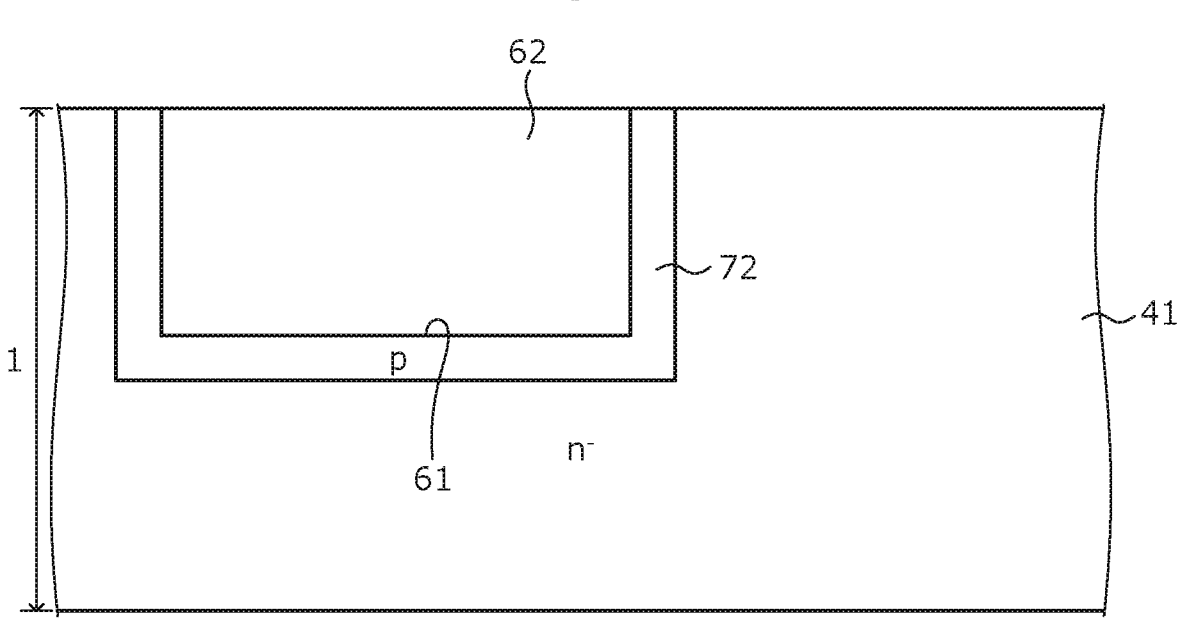
FIG. 24 is a cross-sectional view depicting another example of a state the semiconductor device according to the fourth embodiment during manufacture.
Figure 25:
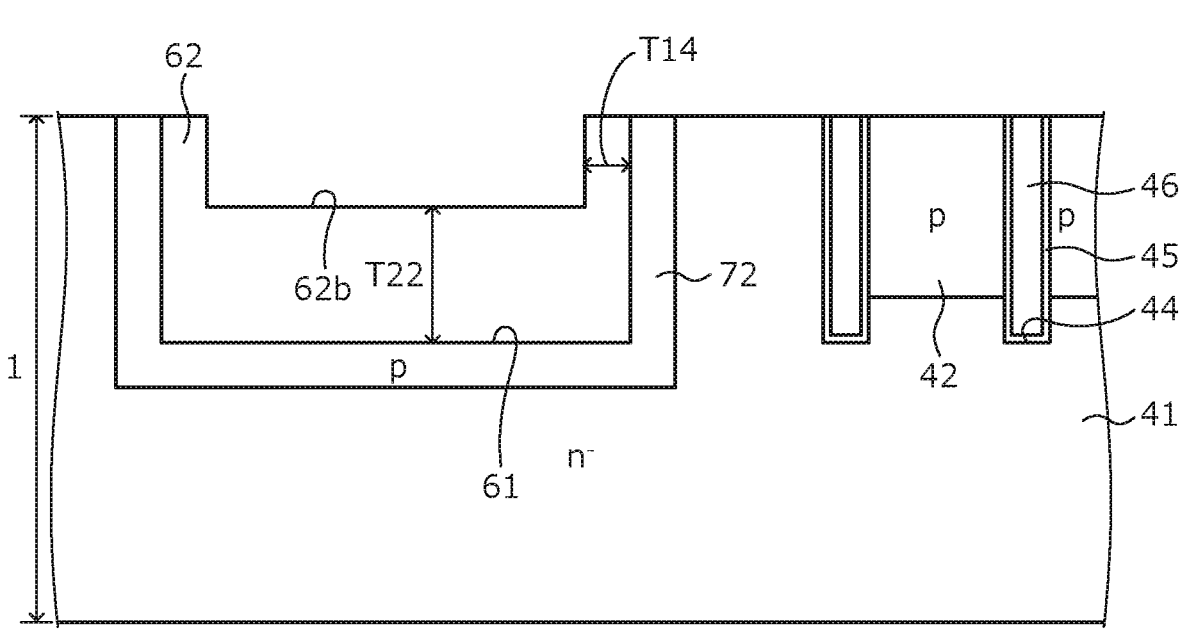
FIG. 25 is a cross-sectional view depicting another example of a state the semiconductor device according to the fourth embodiment during manufacture.
Figure 26:
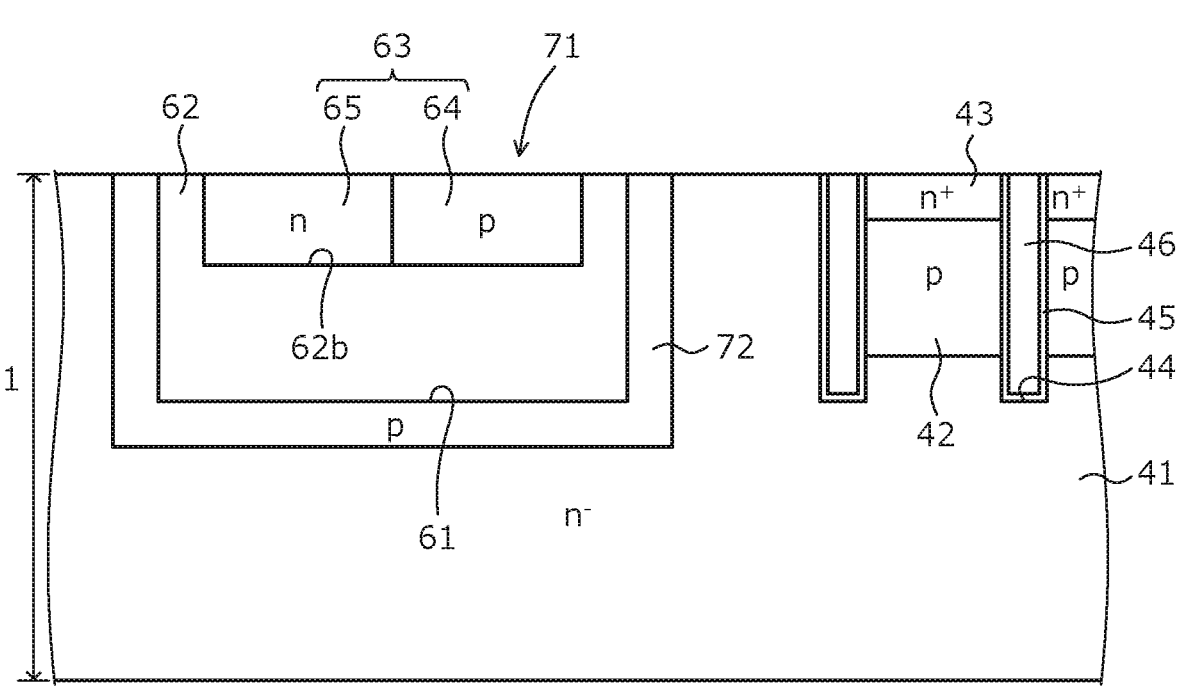
FIG. 26 is a cross-sectional view depicting another example of a state the semiconductor device according to the fourth embodiment during manufacture.
Figure 27:
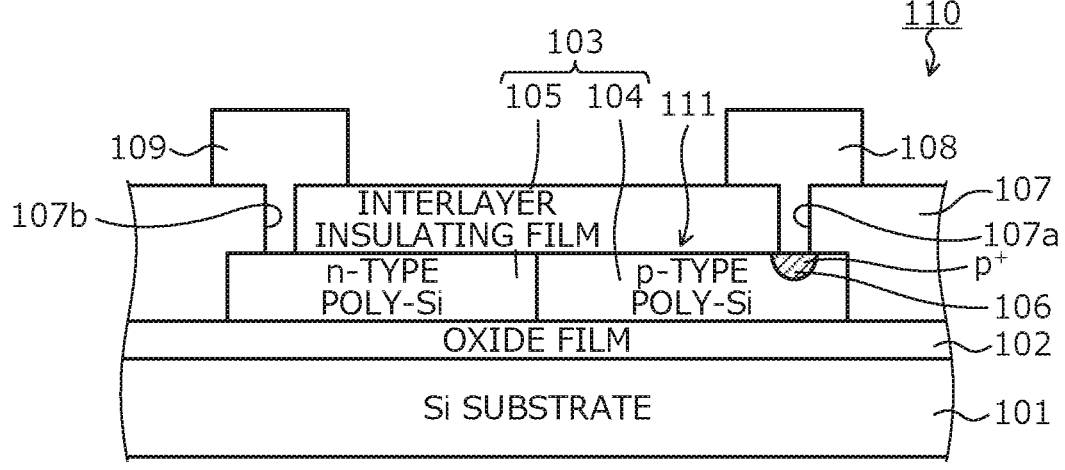
FIG. 27 is a cross-sectional view depicting a structure of a conventional semiconductor device.
Figure 28:
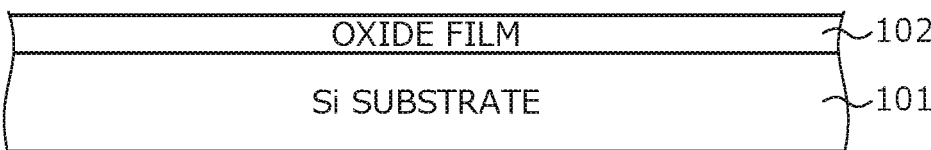
FIG. 28 is a cross-sectional view depicting a state of the conventional semiconductor device during manufacture.
Figure 29:
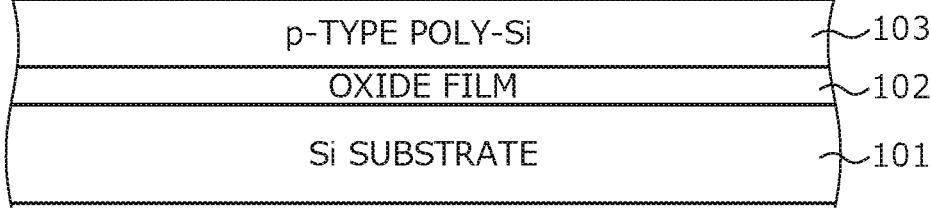
FIG. 29 is a cross-sectional view depicting a state of the conventional semiconductor device during manufacture.
Figure 30:
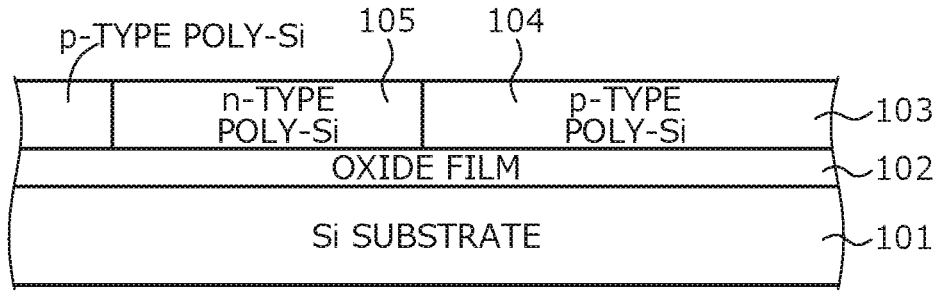
FIG. 30 is a cross-sectional view depicting a state of the conventional semiconductor device during manufacture.

Another example of the method of manufacturing the semiconductor device 60 according to the fourth embodiment is described. FIGS. 24, 25, and 26 are cross-sectional views depicting another example of states the semiconductor device according to the fourth embodiment during manufacture. First, as described above, the recessed portion 61, the p-type region 72, the p-type base region 42, the gate trenches 44, the gate insulating films 45, and the gate electrodes 46 are formed (refer to FIGS. 16 to 18). Next, as depicted in FIG. 24, the field oxide film 62 is formed in the recessed portion 61, the recessed portion 61 being completely embedded with the field oxide film 62.

For example, the field oxide film 62 is assumed to be a LOCOS film (local oxide film), whereby the field oxide film 62 may be formed locally only in the recessed portion 61. In this instance, the inner wall of the recessed portion 61 is oxidized, thereby forming the LOCOS film and thus, the dimensions (width and depth) of the recessed portion 61 are greater than before formation of the field oxide film 62. Alternatively, the field oxide film 62 is formed on the front surface of the semiconductor substrate 1 so that the recessed portion 61 is completely embedded with the field oxide film 62 and thereafter, the field oxide film 62 on the front surface of the semiconductor substrate 1 may be etched-back.

Next, as depicted in FIG. 25, a recess (second recess) 62b having predetermined dimensions (width and depth) that enable disposal of the diode 71 is formed at the surface of the field oxide film 62 by etching. Next, as depicted in FIG. 26, the recess 62b at the surface of the field oxide film 62 is completely embedded with the polysilicon layer 63. Subsequently, the diode 71 is formed by the polysilicon layer 63 as described above. Further, as described above, the n⁺-type emitter region 43 is formed in the active region 40. Thereafter, as described above, formation of the interlayer insulating film 67 and subsequent processes are sequentially performed, whereby the semiconductor device 60 depicted in FIG. 15 is completed.

In this manner, in the other example of the method of manufacturing the semiconductor device 60 according to the fourth embodiment, the recess 62b in which the diode 71 is disposed is actively formed at the surface of the field oxide film 62 and thus, the dimensions of the recessed portion 61, the thickness of the field oxide film 62, and the dimensions of the recess 62b are independent of one another. Thus, the thickness T14 of the field oxide film 62 on the sidewalls of the recessed portion 61 and a thickness T22 of the field oxide film 62 on the bottom of the recessed portion 61 may be different from each other, and the dimensions of the recessed portion 61, the thickness of the field oxide film 62, and the dimensions of the recess 62b may be suitably set according to chip size, insulation characteristics of the field oxide film 62, etc.

The first embodiment (refer to FIG. 1) may be applied to the semiconductor device 60 according to the fourth embodiment and instead of the contact holes 67a, 67b, contact trenches that terminate in the polysilicon layer 63 may be formed. In this instance, instead of the p⁺-type regions 66, similarly to the first embodiment, a p⁺-type region is formed at the bottom of the contact trenches of the polysilicon layer 63. In addition, cross-sectional shapes of the contact trenches of the polysilicon layer 63 and the contact trench 47 of the main semiconductor device may be substantially rectangular.

As described, according to the fourth embodiment, effects similar to those of the first to third embodiments may be obtained.

Further, in an instance in which the polysilicon layer (diode) is disposed on the front surface of the semiconductor substrate via the field oxide film, the greater are the thicknesses of field oxide film and the polysilicon layer, the greater is a step at the upper surface of the interlayer insulating film at the border between the active region and the diode region and thus, formation of a pattern (contact trenches, contact holes, etc.) of a fine device structure of the main semiconductor device becomes difficult and during patterning of the front electrodes (the anode electrode, the cathode electrode, the emitter electrode), the contact holes of the diode region may be destroyed.

Further, in an instance in which the polysilicon layer (diode) is disposed on the front surface of the semiconductor substrate via the field oxide film, when the depth of the contact trenches of the polysilicon layer is increased, the contact trenches may penetrate through the field oxide film and reach the semiconductor substrate or the thickness of the field oxide film may be too thin directly beneath the bottoms of the contact trenches. In this instance, dielectric breakdown of the field oxide film may occur due to static electricity or application of voltage to the main semiconductor device, and the diode may short-circuit with the semiconductor substrate and cease functioning as a temperature sensor.

On the other hand, according to the fourth embodiment, the polysilicon layer (diode) is disposed in the recess (the recessed portion) at the front surface of the semiconductor substrate, whereby no step at the upper surface of the interlayer insulating film occurs. Thus, pattern defects of the main semiconductor device, wiring defects of the diode, and the like may be prevented. Further, the depth of the recessed portion is a suitable depth and thus, the thickness of the field oxide film may be a suitable thickness. As a result, even when the depth of the contact trenches of the polysilicon layer is deep, predetermined dielectric breakdown may be ensured.

In the foregoing, the present invention is not limited to the embodiments described and various modifications within a range not departing from the spirit of the invention are possible. Further, even in an instance in which the diode of the described embodiments alone is fabricated, effects similar to those of the present invention are obtained and the diode alone may be fabricated by a lower cost. Further, application is possible even in an instance in which the main semiconductor device is a MOSFET instead of the IGBT. Further, even when the main semiconductor device is a planar gate structure instead of the trench gate structure, provided the main semiconductor device has the contact trenches, effects similar to those of the present invention are obtained. Further, in the embodiments, while a first conductivity type is assumed to be a p-type and a second conductivity type is assumed to be an n-type, the present invention is similarly implemented when the first conductivity type is an n-type and the second conductivity type is a p-type.

According to the invention described above, as compared to the conventional method, while formation processes for the contact trenches increase, newly forming resist masks is unnecessary for processes from the formation of the contact holes of the interlayer insulating film, to the formation of the first first-conductivity-type high-concentration region and as compared to the conventional method, the number of sessions of the set of processes (depositing resist, pattern formation, and removal) for forming a resist mask may be reduced to one session. Thus, the manufacturing cost may be reduced throughout the manufacturing process as compared to conventional methods, thereby enabling diodes to be formed at lower cost.

The semiconductor device and the method of manufacturing a semiconductor device according to the present invention achieves an effect in that a diode may be formed at a low cost.

As described, the semiconductor device and the method of manufacturing a semiconductor device according to the invention are useful for power semiconductor devices used in power converting equipment, power source devices of various types of industrial machines, and the like and is particularly suitable for semiconductor devices in which a diode constituting a temperature sensor is disposed on a single semiconductor substrate having a main semiconductor device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:

a semiconductor substrate having a first main surface and a second main surface opposite to each other;

an insulating film provided on the semiconductor substrate;

a polysilicon layer provided at the first main surface of the semiconductor substrate via the insulating film;

a first-conductivity-type region and a second-conductivity-type region that are provided in the polysilicon layer and that are adjacent to each other in a direction parallel to the first main surface of the semiconductor substrate to form a pn junction therebetween, whereby a diode is formed by the pn junction;

an interlayer insulating film provided at the first main surface of the semiconductor substrate, the interlayer insulating film covering the polysilicon layer;

a first contact hole penetrating through the interlayer insulating film in a depth direction of the semiconductor device, the first contact hole having a first bottom end that reaches the polysilicon layer;

a second contact hole penetrating through the interlayer insulating film in the depth direction, the second contact hole having a second bottom end that reaches the polysilicon layer;

a first contact trench penetrating the polysilicon layer to be continuous from the first bottom end of the first contact hole in the depth direction, an outer periphery of the first contact trench being surrounded by the first-conductivity-type region;

a second contact trench penetrating the polysilicon layer to be continuous from the second bottom end of the second contact hole in the depth direction, an outer periphery of the second contact trench being surrounded by the second-conductivity-type region;

a first first-conductivity-type high-concentration region selectively provided in the polysilicon layer and being in contact with the first-conductivity-type region, so as to be in direct contact with a bottom, sidewalls or both the bottom and the sidewalls of the first contact trench, the first first-conductivity-type high-concentration region having an impurity concentration that is higher than an impurity concentration of the first-conductivity-type region;

a first electrode embedded in the first contact hole and the first contact trench, and being in contact with the first first-conductivity-type high-concentration region; and a second electrode embedded in the second contact hole and the second contact trench, and being in contact with the second-conductivity-type region.

2. The semiconductor device according to claim 1, wherein the first contact hole terminates in the first-conductivity-type region so that the bottom of the first contact trench in the depth direction is located within the first-conductivity-type region, the second contact hole terminates in the second-conductivity-type region so that a bottom of the second contact trench in the depth direction is located within the second-conductivity-type region, and the semiconductor device further comprises a second first-conductivity-type high-concentration region selectively provided in the polysilicon layer and in contact with the second-conductivity-type region, so as to be in direct contact with only the bottom of the second contact trench, the second first-conductivity-type high-concentration region having an impurity concentration that is higher than the impurity concentration of the first-conductivity-type region.

3. The semiconductor device according to claim 1, wherein the first contact hole penetrates through the polysilicon layer in the depth direction and reaches the insulating film, the second contact hole penetrates through the polysilicon layer in the depth direction and reaches the insulating film, and the first first-conductivity-type high-concentration region is in direct contact with the sidewalls of the first contact trench.

4. The semiconductor device according to claim 3, wherein the first contact hole terminates in the insulating film so that the bottom of the first contact trench in the depth direction is located within the insulating film, and the second contact hole terminates in the insulating film so that a bottom of the second contact trench in the depth direction is located within the insulating film.

5. The semiconductor device according to claim 1, further comprising a main semiconductor device, provided in the semiconductor substrate at the first main surface, and having a device structure, wherein the diode is provided apart from the main semiconductor device and is electrically insulated from the main semiconductor device by the insulating film.

6. The semiconductor device according to claim 5, wherein the main semiconductor device has:

a first semiconductor region of a first conductivity type, provided at the first main surface in the semiconductor substrate, the interlayer insulating film further covering the first main surface of the semiconductor substrate of the main semiconductor device;

a second semiconductor region of a second conductivity type, provided between the second main surface of the semiconductor substrate and the first semiconductor region;

the device structure having a pn junction between the first semiconductor region and the second semiconductor region;

a third contact hole penetrating through the interlayer insulating film in the depth direction, the third contact hole having a third bottom end that reaches the semiconductor substrate;

a third contact trench provided in the semiconductor substrate to be continuous from the third bottom end of the third contact hole in the depth direction, an outer periphery of the third contact trench being surrounded by the first semiconductor region;

a third first-conductivity-type high-concentration region provided between the third contact trench and the first semiconductor region and being in contact with the first semiconductor region, the third first-conductivity-type high-concentration region being in direct contact with at least a bottom of the third contact trench, the third first-conductivity-type high-concentration region having an impurity concentration that is higher than an impurity concentration of the first semiconductor region;

a third electrode embedded in the third contact hole and the third contact trench, and being in contact with the third first-conductivity-type high-concentration region; and a fourth electrode provided at the second main surface of the semiconductor substrate.

7. The semiconductor device according to claim 6, wherein a depth of the first contact hole from an interface between the polysilicon layer and the interlayer insulating film is a same as a depth of the third contact hole from an interface between the semiconductor substrate and the interlayer insulating film, and a depth of the second contact hole from the interface between the polysilicon layer and the interlayer insulating film is the same as the depth of the third contact hole from the interface between the semiconductor substrate and the interlayer insulating film.

8. The semiconductor device according to claim 5, wherein the diode is a temperature sensor that detects a temperature of the main semiconductor device.

9. The semiconductor device according to claim 1, wherein the insulating film is provided on the first main surface of the semiconductor substrate, the polysilicon layer is provided on the first main surface of the semiconductor substrate via the insulating film.

10. The semiconductor device according to claim 1, further comprising a recess provided at the first main surface of the semiconductor substrate, wherein the insulating film is provided along an inner wall of the recess, and the polysilicon layer is provided on the insulating film in the recess.

11. A method of manufacturing the semiconductor device of claim 1, the method comprising:

providing the semiconductor substrate having the first main surface and the second main surface opposite to each other;

providing the insulating layer on the first main surface of the semiconductor substrate:

forming the polysilicon layer at the first main surface, via the insulating film;

forming, in the polysilicon layer, the first-conductivity-type region and the second-conductivity-type region adjacent to each other in the direction parallel to the first main surface of the semiconductor substrate;

forming the interlayer insulating film at the first main surface of the semiconductor substrate, the interlayer insulating film covering the polysilicon layer;

forming, on the interlayer insulating film, a resist mask having a plurality of openings at a plurality of locations;

etching the interlayer insulating film, as a first etching, using the resist mask, thereby forming the first contact hole and the second contact hole that penetrate through the interlayer insulating film in the depth direction of the semiconductor device and reach the polysilicon layer, the first contact hole exposing the first-conductivity-type region and the second contact hole exposing the second-conductivity-type region;

etching the polysilicon layer, as a second etching, using the resist mask, thereby forming the first contact trench in the first-conductivity-type region to be continuous from the first bottom end of the first contact hole in the depth direction, and forming the second contact trench in the second-conductivity-type region to be continuous from the second bottom end of the second contact hole in the depth direction;

performing an ion-implantation of a first-conductivity-type impurity, using the resist mask, thereby forming the first first-conductivity-type high-concentration region in the first contact trench of the first-conductivity-type region with the impurity concentration of the first first-conductivity-type high-concentration region higher than the impurity concentration of the first-conductivity-type region;

removing the resist mask; and embedding the first electrode in the first contact hole and in contact with the first first-conductivity-type high-concentration region, and embedding the second electrode in the second contact hole and in contact with the second-conductivity-type region.

12. The method according to claim 11, wherein forming the polysilicon layer includes:

forming a first recess at the first main surface of the semiconductor substrate, the first recess having a predetermined depth;

forming the insulating film along an inner wall of the first recess and leaving a second recess at a surface of the insulating film in the first recess; and embedding the polysilicon layer in the second recess.

13. The method according to claim 11, wherein forming the polysilicon layer includes:

forming a first recess at the first main surface of the semiconductor substrate, the first recess having a predetermined depth;

embedding the insulating film in the first recess;

forming a second recess at a surface of the insulating film; and embedding the polysilicon layer in the second recess.

14. The method according to claim 11, wherein the semiconductor device has a main semiconductor device in the semiconductor substrate and the diode on the semiconductor substrate, the main semiconductor device has:

a first semiconductor region of a first conductivity type provided at the first main surface in the semiconductor substrate, the interlayer insulating film further covering the first main surface of the semiconductor substrate of the main semiconductor device;

a second semiconductor region of a second conductivity type provided between the second main surface of the semiconductor substrate and the first semiconductor region;

a device structure having a pn junction between the first semiconductor region and the second semiconductor region;

a third contact hole penetrating the interlayer insulating film in the depth direction;

a third contact trench provided in the semiconductor substrate to be continuous from a bottom end of the third contact hole in the depth direction, an outer periphery of the third contact trench being surrounded by the first semiconductor region;

a third first-conductivity-type high-concentration region provided between the third contact trench and the first semiconductor region, in contact with the first semiconductor region, the third first-conductivity-type high-concentration region being in direct contact with at least a bottom of the third contact trench, and having an impurity concentration that is higher than an impurity concentration of the first semiconductor region;

a third electrode embedded in the third contact hole and the third contact trench, the third electrode being in contact with the third first-conductivity-type high-concentration region; and a fourth electrode provided at the second main surface of the semiconductor substrate, the diode is provided apart from the main semiconductor device and is electrically insulated from the main semiconductor device by the insulating film, the third contact hole is formed by the first etching concurrently with the forming the first contact hole and the second contact hole, the third contact trench is formed by the second etching concurrently with the forming the first contact trench and the second contact trench, and the third first-conductivity-type high-concentration region is formed by the ion-implantation concurrently with the forming the first first-conductivity-type high-concentration region.

15. The method according to claim 14, wherein the diode is a temperature sensor that detects a temperature of the main semiconductor device.

* * * * *